United States Patent
Khalid et al.

(10) Patent No.: US 11,486,999 B2
(45) Date of Patent: Nov. 1, 2022

(54) RADAR SYSTEM COMPRISING A PLURALITY OF RADAR CHIPS

(71) Applicant: Infineon Technologies AG, Neubiberg (DE)

(72) Inventors: Farhan Bin Khalid, Munich (DE); Andreas Och, Linz (AT); Alexander Melzer, Neutillmitsch (AT); Clemens Pfeffer, Linz (AT); Andre Roger, Munich (DE); Philipp Schmidt, Wels (AT)

(73) Assignee: Infineon Technologies AG, Neubiberg (DE)

( * ) Notice: Subject to any disclaimer, the term of this patent is extended or adjusted under 35 U.S.C. 154(b) by 361 days.

(21) Appl. No.: 16/360,818

(22) Filed: Mar. 21, 2019

(65) Prior Publication Data

US 2019/0293784 A1 Sep. 26, 2019

(30) Foreign Application Priority Data

Mar. 22, 2018 (DE) .......................... 102018106898.0
Mar. 8, 2019 (DE) .......................... 102019106030.3

(51) Int. Cl.
*G01S 13/87* (2006.01)
*G01S 7/03* (2006.01)
(Continued)

(52) U.S. Cl.
CPC ............. *G01S 13/87* (2013.01); *G01S 7/03* (2013.01); *G01S 7/282* (2013.01); *G01S 7/285* (2013.01); *G01S 13/003* (2013.01)

(58) Field of Classification Search
CPC ........ G01S 7/032; G01S 13/931; G01S 13/87; G01S 13/343; G01S 7/03; G01S 13/42; G01S 13/88; G01S 13/878; G01S 7/352; G01S 2007/356; G01S 7/282; G01S 7/4017; G01S 13/003; G01S 7/4004; G01S 7/4008; G01S 7/285; G01S 13/584; G01S 13/02; G01S 2013/0236; G01F 23/284; H01L 2223/6627; H01L 2223/6683; H01L 2224/131; H01L 2224/16227
See application file for complete search history.

(56) References Cited

U.S. PATENT DOCUMENTS 9,880,261 B2 * 1/2018 Subburaj ................. G01S 7/036
2006/0105733 A1 * 5/2006 Singh ....................... H03D 9/06
455/304

(Continued)

*Primary Examiner* — Olumide Ajibade Akonai
(74) *Attorney, Agent, or Firm* — Harrity & Harrity, LLP

(57) ABSTRACT

A radar system is described. In accordance with one example implementation, the radar system comprises a passive coupler arrangement and also a first radar chip, a second radar chip and a third radar chip. The radar chips each comprise at least one external RF contact and also a local oscillator designed to generate an RF oscillator signal at least in a switched-on state. The external RF contacts of the radar chips are coupled via the coupler arrangement in such a way that, in a first operating mode, the RF oscillator signal can be transferred from the first radar chip via the coupler arrangement to the second radar chip and the third radar chip, and that, in a second operating mode, the RF oscillator signal can be transferred from the second radar chip via the coupler arrangement to the third radar chip.

26 Claims, 16 Drawing Sheets

(51) Int. Cl.
*G01S 7/285* (2006.01)
*G01S 7/282* (2006.01)
*G01S 13/00* (2006.01)

(56) References Cited

U.S. PATENT DOCUMENTS

| | | | |
|---|---|---|---|
| 2013/0300627 A1* | 11/2013 | Sankaran | H01P 5/222 |
| | | | 333/120 |
| 2015/0035604 A1* | 2/2015 | Holmes | H03F 3/211 |
| | | | 333/117 |
| 2015/0153445 A1* | 6/2015 | Jansen | G01S 7/032 |
| | | | 701/93 |
| 2016/0329972 A1* | 11/2016 | Dominizi | H04B 17/0085 |
| 2017/0023663 A1* | 1/2017 | Subburaj | G01S 7/032 |
| 2017/0090015 A1* | 3/2017 | Breen | G01S 7/4056 |
| 2018/0115409 A1* | 4/2018 | Nayyar | G01S 13/343 |
| 2019/0107427 A1* | 4/2019 | Waelde | G01S 7/032 |
| 2019/0107429 A1* | 4/2019 | Waelde | G01S 7/032 |
| 2019/0187273 A1* | 6/2019 | Tong | G01S 13/878 |
| 2019/0204846 A1* | 7/2019 | Reuter | H04B 10/60 |

* cited by examiner

RADAR SYSTEM COMPRISING A PLURALITY OF RADAR CHIPS

RELATED APPLICATIONS

This application claims priority under 35 U.S.C. § 119 to German Patent Application No. 102018106898.0 filed on Mar. 22, 2018, and to German Patent Application No. 102019106030.3, filed on Mar. 8, 2019, the contents of which are incorporated by reference herein in their entirety.

TECHNICAL FIELD

The present description relates to the field of radio-frequency (RF) circuits. Some example implementations relate to a device comprising two or more cascaded monolithic microwave integrated circuits (MMICs), which can be used e.g. in radar sensors.

BACKGROUND

Radio-frequency (RF) transmitters and receivers are used in a multiplicity of applications, particularly in the field of wireless communication and radar sensors. In the automotive field, there is an increasing need for radar sensors which can be used, inter alia, in driver assistance systems (Advanced driver assistance systems, ADAS) such as e.g. in cruise control (ACC, Adaptive Cruise Control, or Radar Cruise Control) systems. Such systems can automatically adapt the speed of an automobile in order to maintain a safe distance from other automobiles ahead (and also other objects and pedestrians). Further applications in the automotive field are e.g. blind spot detection, lane change assist and the like. In the field of autonomous driving, radar sensors and systems comprising a plurality of sensors will play an important part for the control of autonomous vehicles.

Modern radar systems use large scale integrated RF circuits which can combine all core functions of an RF frontend of a radar transceiver in a single housing (single-chip radar transceiver). Such large scale integrated RF circuits are usually referred to as monolithic microwave integrated circuits (MMICs). An RF frontend usually (but not necessarily) includes, inter alia, a voltage controlled oscillator (VCO) connected in a phase locked loop, power amplifiers (PAs), directional couplers, mixers and associated control circuit arrangements for controlling and monitoring the RF frontend. An MIMIC can also comprise circuits for the analog signal processing in baseband (or an intermediate frequency band) and analog-to-digital converters (ADCs), in order to enable digital signal processing. Instead of VCOs, digitally controlled oscillators (DCOs) can also be used, depending on the application. In sensor applications, a plurality of MMICs can also be interconnected (cascaded), for example in order to emit and/or to receive RF radar signals via a plurality of antennas. Such arrangements comprising a plurality of antennas can be used for beam forming techniques, for example. A plurality of receiving antennas are necessary, inter alia, if the angle of incidence of the received radar echoes (DoA, Direction of Arrival) is intended to be ascertained.

With regard to the functional reliability (cf. ISO standard 26262) of a radar sensor device, it may be desirable for a system comprising a plurality of MMICs to remain functional even if one or more MMICs do not operate (any longer) in accordance with the desired specifications.

SUMMARY

A radar system is described hereinafter. In accordance with one example implementation, the radar system comprises a passive coupler arrangement and also a first radar chip, a second radar chip and a third radar chip. The radar chips each comprise at least one external RF contact and also a local oscillator designed to generate an RF oscillator signal at least in a switched-on state. The external RF contacts of the radar chips are coupled via the coupler arrangement in such a way that, in a first operating mode, the RF oscillator signal can be transferred from the first radar chip via the coupler arrangement to the second radar chip and the third radar chip, and that, in a second operating mode, the RF oscillator signal can be transferred from the second radar chip via the coupler arrangement to the third radar chip (3).

Furthermore, a description is given of a method for operating a radar system comprising at least three radar chips, one of which is operated in a master mode in which it generates an RF oscillator signal that is transferred to the other radar chips, which are operated in a slave mode. In accordance with one example implementation, the method comprises detecting whether the radar chip operated in the master mode is operating properly, and—if the radar chip operated in the master mode is not operating properly—reconfiguring the radar system, wherein a radar chip previously operated in the slave mode is operated in the master mode, such that it generates the RF oscillator signal that is transferred to the other radar chips.

A further example implementation relates to a radar system comprising a first radar chip, a second radar chip and a third radar chip, each comprising at least one external RF contact. At least the first and the second of the radar chips each comprise a local oscillator designed to generate an RF oscillator signal in a switched-on state, wherein the external RF contacts of the radar chips are couplable in such a way that, in a first operating mode, the RF oscillator signal can be generated by the first radar chip and transferred to the second radar chip and to the third radar chip, and that, in a second operating mode, in which the first radar chip is configured as inactive, the RF oscillator signal can be generated by the second radar chip and transferred to the third radar chip.

A further example implementation relates to a radar system comprising a first subsystem and a second subsystem. The first subsystem comprises a first radar chip and a second radar chip, and the second subsystem comprises at least one third radar chip. The second radar chip of the first subsystem is designed, in a first operating mode, either to generate an RF oscillator signal and to output it at an RF output or to output an RF oscillator signal received from a different radar chip of the first subsystem at the RF output, wherein the third radar chip of the second subsystem is designed, in the first operating mode, to receive the RF oscillator signal output by the second radar chip of the first subsystem at an RF input, and wherein the third radar chip of the second subsystem is further designed, in a second operating mode, either to generate a further RF oscillator signal or to receive a further RF oscillator signal generated by a different radar chip of the second subsystem.

A further example implementation relates to a radar system comprising a first subsystem comprising a first radar chip and a second radar chip and a second subsystem comprising a third radar chip and a fourth radar chip. The second radar chip of the first subsystem and the fourth radar chip of the second subsystem comprise TX channels for connecting transmitting antennas, but no RX channel. The second radar chip of the first subsystem is directly or indirectly coupled to the first radar chip of the first subsystem in order to receive an LO signal output by the latter. In a similar manner, the fourth radar chip of the second subsystem is directly or indirectly coupled to the third radar chip of the second subsystem in order to receive an LO signal output by the latter. The first radar chip of the first subsystem is designed, in a first operating mode, by means of a local oscillator, to generate the LO signal and to transfer it via one or more RF lines directly or indirectly to the third radar chip of the second subsystem. The third radar chip of the second subsystem is designed, in a second operating mode, in which no LO signal is transferred into the second subsystem by the first subsystem, to generate a further LO signal by means of a further local oscillator.

BRIEF DESCRIPTION OF THE DRAWINGS

Example implementations are explained in greater detail below with reference to figures. The illustrations are not necessarily true to scale and the example implementations are not restricted only to the aspects illustrated. Rather, importance is attached to illustrating the principles underlying the example implementations. In the figures:

FIGS. 16A-16D show block diagrams of a further example of a radar system, in which five slave MMICs are connected to a master MMIC, wherein FIG. 16A illustrates the system with six functional MMICs, and FIGS. 16B-16D illustrate the system with various defective MMICs.

FIGS. 17A-17C show an example similar to that in FIGS. 16A-16D, wherein FIG. 17A illustrates the system with six functional MMICs, and FIGS. 17B and 17C illustrate the system with one defective MMIC in each case.

DETAILED DESCRIPTION

Figure 1:
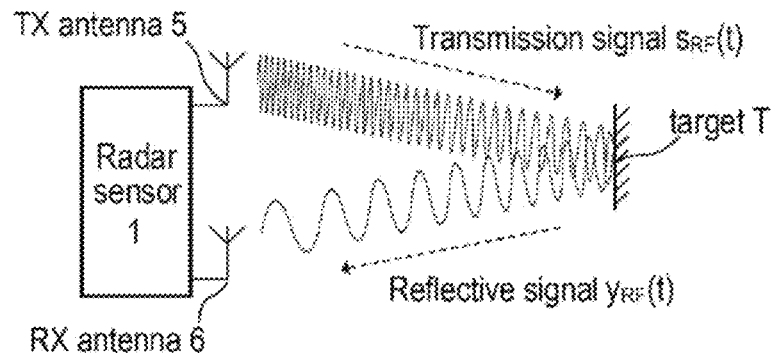
FIG. 1 is a schematic diagram for illustrating the functional principle of an FMCW radar system for distance and/or speed measurement.

FIG. 1 illustrates the application of an FMCW radar system as sensor for the measurement of distances and speeds of objects, which are usually referred to as radar targets. In the present example, the radar device 1 comprises separate transmitting (TX) and receiving (RX) antennas 5 and 6 respectively (bistatic or pseudo-monostatic radar configuration). It should be noted, however, that a single antenna can also be used, which serves simultaneously as transmitting antenna and as receiving antenna (monostatic radar configuration). The transmitting antenna 5 emits a continuous RF signal $s_{RF}(t)$, which is frequency-modulated for example with a linear chirp signal (periodic, linear frequency ramp). The emitted signal $s_{RF}(t)$ is backscattered at the radar target T and the backscattered (reflected) signal $y_{RF}(t)$ is received by the receiving antenna 6. FIG. 1 shows a simplified example; in practice, radar sensors are systems comprising a plurality of transmitting (TX) and receiving (RX) channels. Examples of a MIMO (multiple-input/multiple-output) radar system will be discussed later with reference to FIGS. 5-9.

Figure 2:
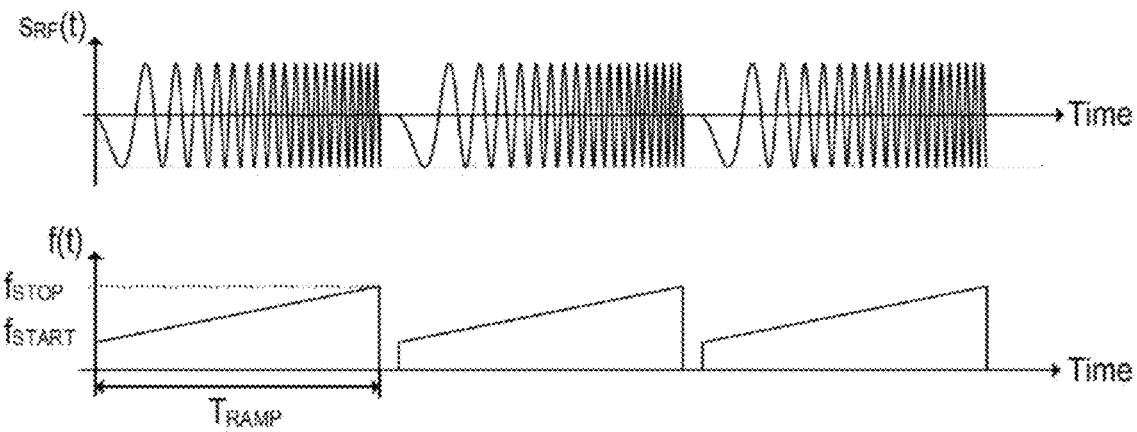
FIG. 2 comprises two timing diagrams for illustrating the frequency modulation of the RF signal generated by the FMCW system.

FIG. 2 illustrates by way of example the abovementioned frequency modulation of the signal $s_{RF}(t)$. As illustrated in FIG. 2, the signal $s_{RF}(t)$ is composed of a set of "chirps", that is to say that the signal $s_{RF}(t)$ comprises a sequence of sinusoidal signal profiles (waveforms) having a rising (Up-Chirp) or falling (Down-Chirp) frequency (see upper diagram in FIG. 2). In the present example, the instantaneous frequency f(t) of a chirp beginning at a start frequency $f_{START}$ rises linearly within a time period $T_{RAMP}$ to a stop frequency $f_{STOP}$ (see lower diagram in FIG. 2). Such chirps are also referred to as linear frequency ramps. FIG. 2 illustrates three identical linear frequency ramps. It should be noted, however, that the parameters $f_{START}$, $f_{STOP}$, $T_{RAMP}$ and also the pause between the individual frequency ramps can vary. The frequency variation also need not necessarily be linear. Depending on the implementation, transmission signals with exponential (exponential chirps) or hyperbolic (hyperbolic chirps) frequency variation can also be used, for example.

Figure 3:
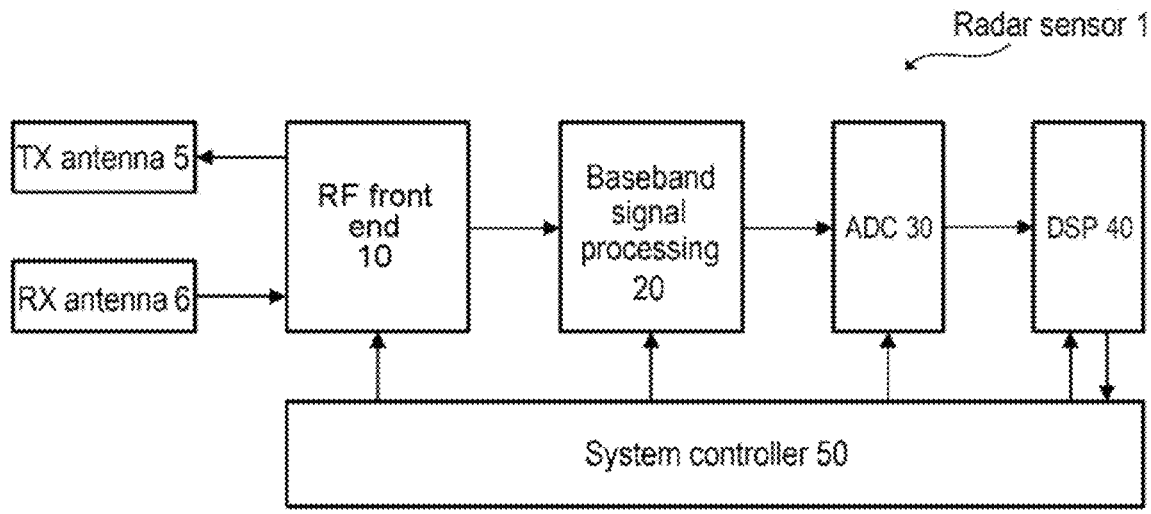
FIG. 3 is a block diagram for illustrating the fundamental structure of an FMCW radar system.

FIG. 3 is a block diagram which illustrates one possible structure of a radar device 1 (radar sensor) by way of example. Accordingly, at least one transmitting antenna 5 (TX antenna) and at least one receiving antenna 6 (RX antenna) are connected to an RF frontend 10 which is integrated in an MMIC and which can include all those circuit components which are used for the RF signal processing. Said circuit components comprise for example a local oscillator (LO), RF power amplifiers, low-noise amplifiers (LNAs), directional couplers (e.g. rat race couplers, circulators, etc.) and mixers for down-converting the RF signals to baseband or an intermediate frequency (IF band). The RF frontend 10—if appropriate together with further circuit components—can be integrated in an MMIC. The example illustrated shows a bistatic (or pseudo-monostatic) radar system comprising separate RX and TX antennas. In the case of a monostatic radar system, a single antenna would be used both for emitting and for receiving the electromagnetic (radar) signals. In this case, a directional coupler (e.g. a circulator) can be used to separate the RF signals to be emitted into the radar channel from the RF signals (radar echoes) received from the radar channel. As mentioned, radar systems in practice usually comprise a plurality of transmitting and receiving channels having a plurality of transmitting and receiving antennas, respectively, which makes it possible, inter alfa, to measure the direction (DoA, direction of arrival) from which the radar echoes are received. In MIMO systems of this type, the individual TX channels and RX channels are usually constructed identically or similarly in each case.

In the case of a frequency-modulated continuous-wave radar system (FMCW radar system), the RF signals emitted via the TX antenna 5 can lie e.g. in the range of approximately 20 GHz to 100 GHz (e.g. around 77 GHz in some applications). As mentioned, the RF signal received by the RX antenna 6 comprises the radar echoes, i.e. those signal components which are backscattered at one or at a plurality of radar targets. The received RF signal $y_{RF}(t)$ is e.g. down-converted to baseband and processed further in baseband by means of analog signal processing (see FIG. 3, analog baseband signal processing chain 20). The analog signal processing mentioned substantially comprises filtering and, if appropriate, amplification of the baseband signal. The baseband signal is finally digitized (see FIG. 3, analog-to-digital converter 30) and processed further in the digital domain. The digital signal processing chain can be realized at least partly as software which can be executed on a processor, for example a microcontroller or a digital signal processor (see FIG. 3, DSP 40). The overall system is generally controlled by means of a system controller 50, which can likewise be implemented at least partly as software which can be executed on a processor such as e.g. a microcontroller. The RF frontend 10 and the analog baseband signal processing chain 20 (optionally also the analog-to-digital converter 30) can be jointly integrated in a single MMIC (i.e. an RF semiconductor chip). Alternatively, the individual components can also be distributed among a plurality of integrated circuits.

Figure 4:
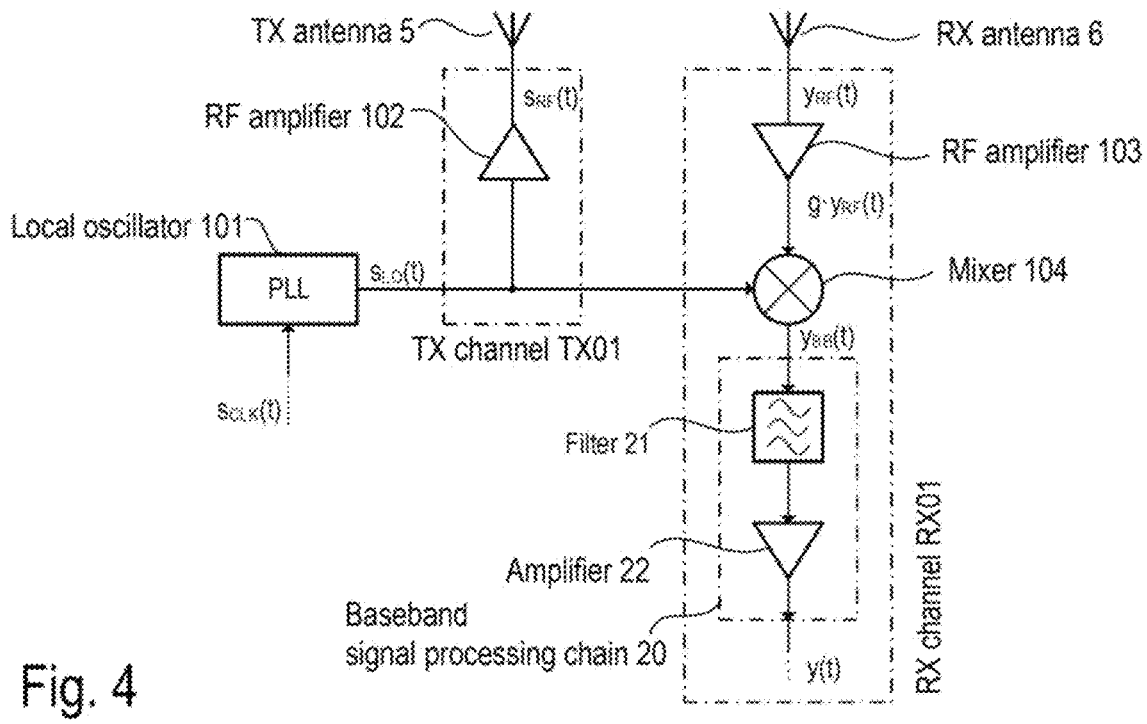
FIG. 4 is a simplified block diagram for illustrating an example implementation of a transmitting channel and of a receiving channel of a radar system.

FIG. 4 illustrates an example implementation of the RF frontend 10 with baseband signal processing chain 20 connected downstream, which can be part of the radar sensor from FIG. 3. It should be noted that FIG. 4 illustrates a simplified circuit diagram in order to show the fundamental structure of the RF frontend with one transmitting channel (TX channel TX01) and one receiving channel (RX channel RX01). Actual implementations, which may depend greatly on the specific application, can be more complex, of course, and generally comprise a plurality of TX and/or RX channels. The RF frontend 10 comprises a local oscillator 101 (LO), which generates an RF oscillator signal $s_{LO}(t)$. The RF oscillator signal $s_{LO}(t)$, as described above with reference to FIG. 2, can be frequency-modulated and is also referred to as LO signal. In radar applications, the LO signal usually lies in the SHF (Super High Frequency, centimeter-wave) or in the EHF (Extremely High Frequency, millimeter-wave) band, e.g. in the interval of 76 GHz to 81 GHz in some automotive applications.

The LO signal $s_{LO}(t)$ is processed both in the transmission signal path (in the TX channel) and in the reception signal path (in the RX channel). The transmission signal $s_{RF}(t)$ (cf. FIG. 2), emitted by the TX antenna 5, is generated by amplifying the LO signal $s_{LO}(t)$, for example by means of the RF power amplifier 102, and is thus merely an amplified version of the LO signal $s_{LO}(t)$. The output of the amplifier 102 can be coupled to the TX antenna 5 (in the case of a bistatic or pseudo-monostatic radar configuration). The reception signal $y_{RF}(t)$ received by the RX antenna 6 is fed to the receiver circuit in the RX channel and thus directly or indirectly to the RF port of the mixer 104. In the present example, the RF reception signal $y_{RF}(t)$ (antenna signal) is preamplified by means of the amplifier 103 (gain g). The amplified RF reception signal $g \cdot y_{RF}(t)$ is thus fed to the mixer 104. The amplifier 103 can be e.g. an LNA. The LO signal $s_{LO}(t)$ is fed to the reference port of the mixer 104, such that the mixer 104 down-converts the (preamplified) RF reception signal $y_{RF}(t)$ to baseband. The down-converted baseband signal (mixer output signal) is designated by $y_{BB}(t)$. Said baseband signal $y_{BB}(t)$ is firstly processed further in analog fashion, wherein the analog baseband signal processing chain 20 substantially brings about amplification (amplifier 22) and filtering (e.g. bandpass filter 21) in order to suppress undesired sidebands and image frequencies. The resulting analog output signal, which is fed to an analog-to-digital converter (see FIG. 3, ADC 30), is designated by y(t). Methods for the digital further processing of the output signal (digital radar signal y[n]) are known per se (for example range doppler analysis) and therefore will not be discussed in further detail here.

In the present example, the mixer 104 down-converts the preamplified RF reception signal $g \cdot y_{RF}(t)$ (i.e. the amplified antenna signal) to baseband. The mixing can take place in one stage (that is to say from the RF band directly to baseband) or via one or more intermediate stages (that is to say from the RF band to an intermediate frequency band and further to baseband). In this case, the reception mixer 104 effectively comprises a plurality of individual mixer stages connected in series. In view of the example shown in FIG. 4, it becomes clear that the quality of a radar measurement depends greatly on the quality of the LO signal $s_{LO}(t)$, for example on the noise contained in the LO signal $s_{LO}(t)$, which is quantitatively determined by the phase noise of the local oscillator 101.

Figure 14:
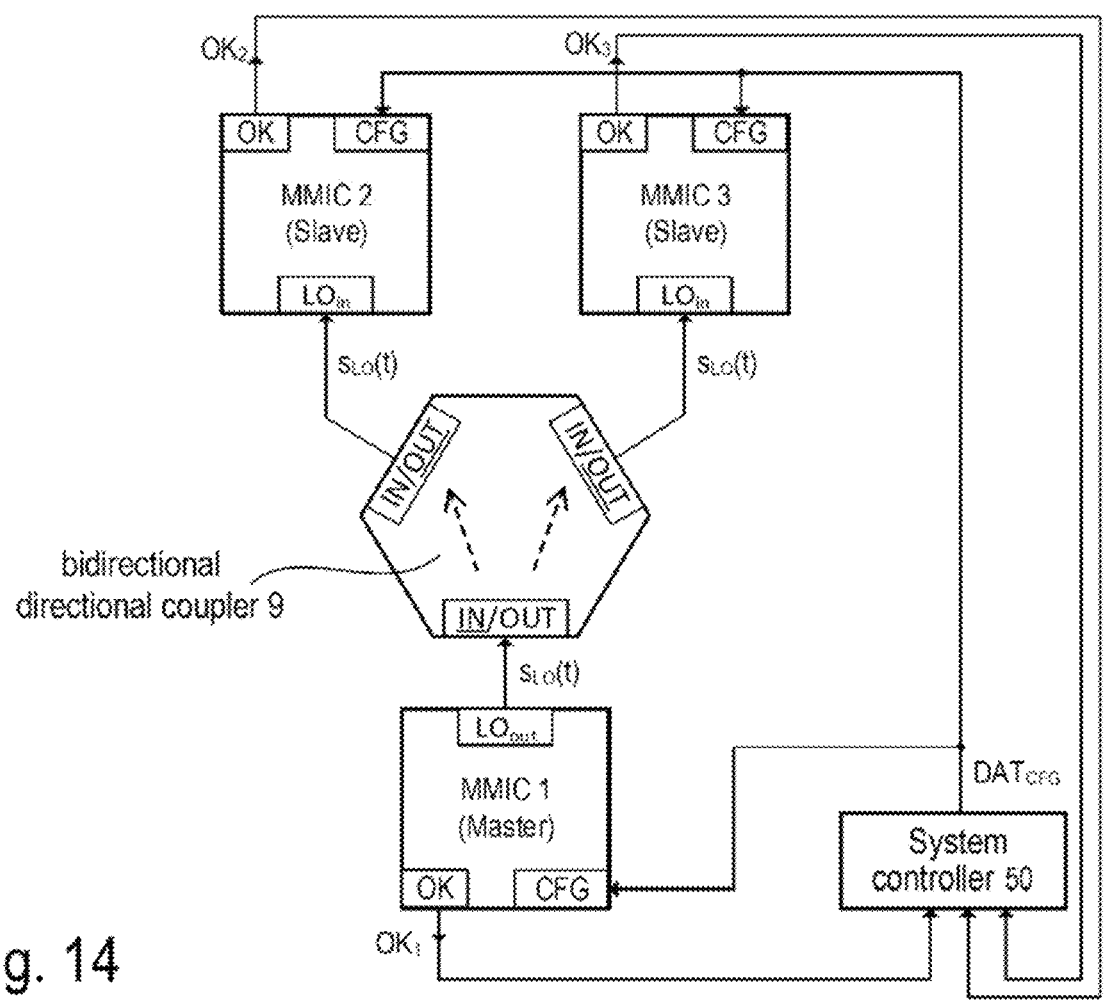
FIG. 14 shows an example similar to that in FIG. 6, wherein the MMICs transmit status signals to a system controller.

In radar systems, the noise floor limits the sensitivity with which radar targets can be detected and, consequently, it also limits the accuracy of the distance measurement. Phase noise can result in a reduction of the reliability of the measurement values or even make it impossible to detect radar targets (in particular having small radar cross sections). At any rate it is of interest for the functional reliability of a radar sensor quantitatively to estimate and to assess the noise contained in an LO signal, and in particular the phase noise, while the radar sensor is in operation. The performance of an MMIC (or of the local oscillator contained therein) with regard to phase noise can vary over the course of time. With regard to the functional reliability of radar systems, the phase noise of the local oscillator can be monitored in an MMIC. For this purpose, an MMIC can include self-test functions designed to test whether the MMIC is operating properly, e.g. whether the performance of the local oscillator with regard to phase noise (still) corresponds to the predefined, desired specifications. If that is not the case, the affected MMIC can indicate the negative test result e.g. by way of a status signal to a superordinate controller (e.g. system controller 50) (cf. also FIG. 14 and the associated explanations).

Figure 5:
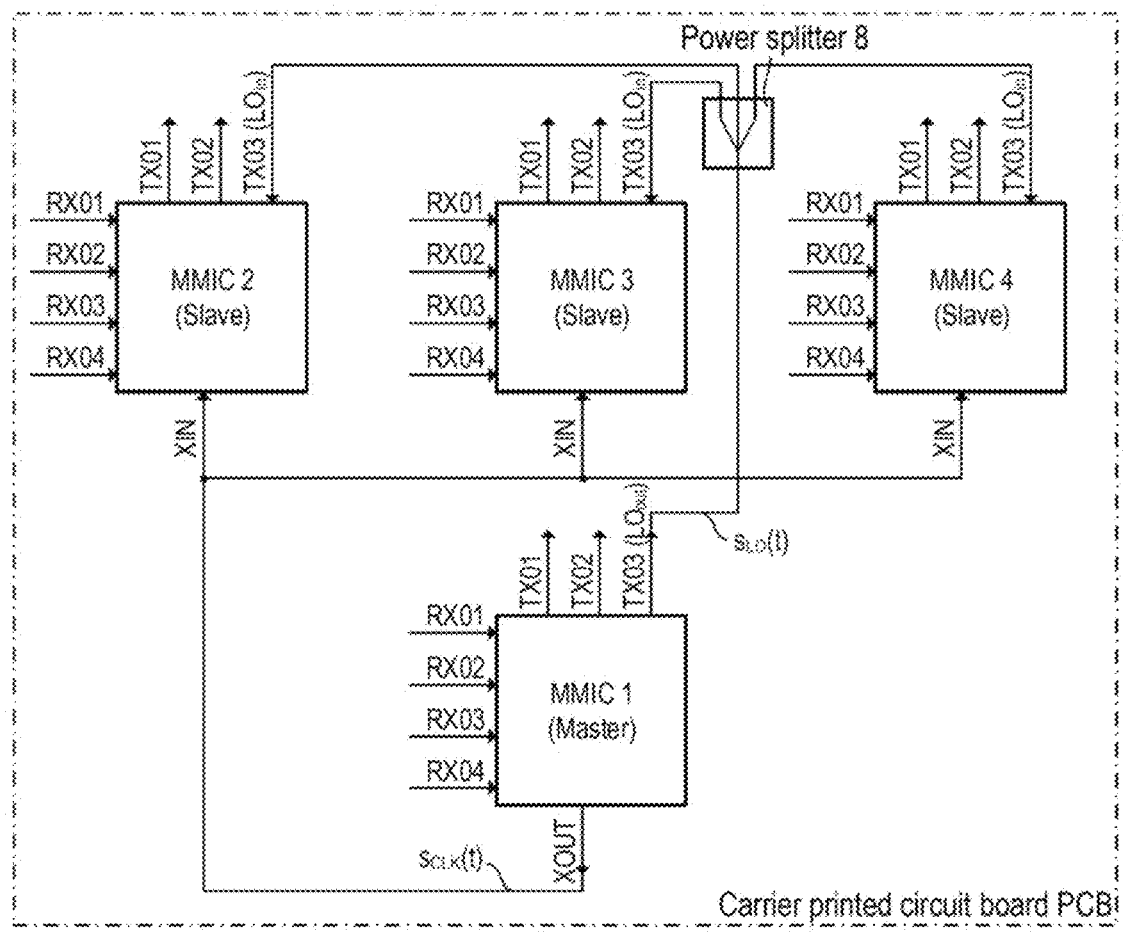
FIG. 5 is a block diagram for illustrating a system comprising a plurality of cascaded MMICs, wherein the local oscillator signal is generated by a master MIMIC and distributed to the slave MMICs.

FIG. 5 is a block diagram illustrating by way of example a MIMO radar system comprising a plurality of coupled (cascaded) MMICs. In the example illustrated, four MMICs are arranged on a carrier PCB, for example a printed circuit board (PCB). Each MMIC 1, 2, 3 and 4 can comprise a plurality of transmitting channels TX01, TX02, etc. and a plurality of receiving channels RX01, RX02, etc. For the operation of the radar system, it is beneficial for the LO signals used by the MMICs to be coherent. Therefore, the LO signal is generated in one MIMIC—the master MMIC 1—and distributed to the slave MMICs 2, 3 and 4. In the example illustrated, for this purpose, the LO signal $s_{LO}(t)$ is passed from an LO output $LO_{out}$ of the master MIMIC 1 to the input of a (unidirectional) power splitter 8; the outputs of the power splitter are connected to LO inputs $LO_{in}$ of the respective slave MMICs 2, 3 and 4. The LO output $LO_{out}$ and the LO inputs $LO_{in}$ can be realized as pin, as solder ball, or suchlike, depending on the chip package. In some example implementations, the LO output $LO_{out}$ and/or the LO inputs $LO_{in}$ can be realized by dedicated external contacts (e.g. pin, solder ball, etc.). In order to keep the number of external contacts of the MMICs small, the output of a transmitting channel (e.g. channel TX03) can also be configured as LO output or LO input. However, a transmitting channel configured as LO output or LO input is then no longer available as an antenna port for connection to a (transmitting) antenna. In accordance with the example illustrated in FIG. 5, in the master MIMIC 1, the RF output of the transmitting channel TX03 can be configured as LO output, for which purpose it is useful to adapt the gain of the RF amplifier (cf. FIG. 4, amplifier 102). The resultant adaptation (reduction) of the signal power may be useful or expedient in order to minimize the crosstalk to the receiving channels RX01, RX02, etc. (cf. FIG. 5) and in order to save energy. In the case of slave MMICs 2, 3 and 4, the RF outputs of the respective transmitting channels TX03 are configured as LO inputs, which can be realized by means of couplers and/or switches.

In the example illustrated, the outputs designated by TX01 and TX02 can be connected to (transmitting) antennas and the inputs designated by RX01, RX02, RX03 and RX04 can be connected to (receiving) antennas. The connection between the MMICs and the power splitter 8 can be realized e.g. by means of (e.g. differential) strip lines on the carrier printed circuit board PCB. The power splitter 8 can also be realized by means of strip lines on the carrier printed circuit board PCB (e.g. as a Wilkinson splitter). It should be pointed out at this juncture that all the MMICs can comprise local oscillators 101 (e.g. PLLs), but the latter are not used in the MMICs 2-4 configured as slaves. For normal radar operation, the LO signal is generated centrally in the master MIMIC and distributed among the slave MMICs. What is achieved in this way is that the LO signals processed in the MMICs are coherent.

In the example illustrated in FIG. 5, the master MMIC 1 generates the LO signal $s_{LO}(t)$ and distributes it via the LO output of the master MIMIC 1 to the slave MMICs 2, 3 and 4, as a result of which a plurality of MMICs can be connected in series (cascaded). The (system) clock signal $s_{CLK}(t)$ can likewise be generated by the master MMIC 1 and distributed to the slave MMICs 2, 3, and 4. For this purpose, the MMICs 1, 2, and 4 each have a separate clock output XOUT or clock input XIN, which can be connected by means of strip lines. The clock signal $s_{CLK}(t)$ can have a clock frequency of a few MHz (e.g. 200 MHz), whereas the LO signal has an LO frequency $f_{LO}$ of a plurality of GHz (e.g. 76-81 GHz). Alternatively, the clock signal can also be generated in a separate clock generator chip, which can contain e.g. a quartz oscillator. In this case, the clock signal $s_{CLK}(t)$ generated by the clock generator chip is fed to all the MMICs (master MMIC 1 and slave MMICs 2-4). In some example implementations, the master MMIC 1 can also be configured such that it generates the clock signal $s_{CLK}(t)$ and the LO signal $s_{LO}(t)$ for the slave MMICs 2-4 and the transmitting and receiving channels TX01, TX02, RX01, RX02, etc. remain unused.

Figure 6:
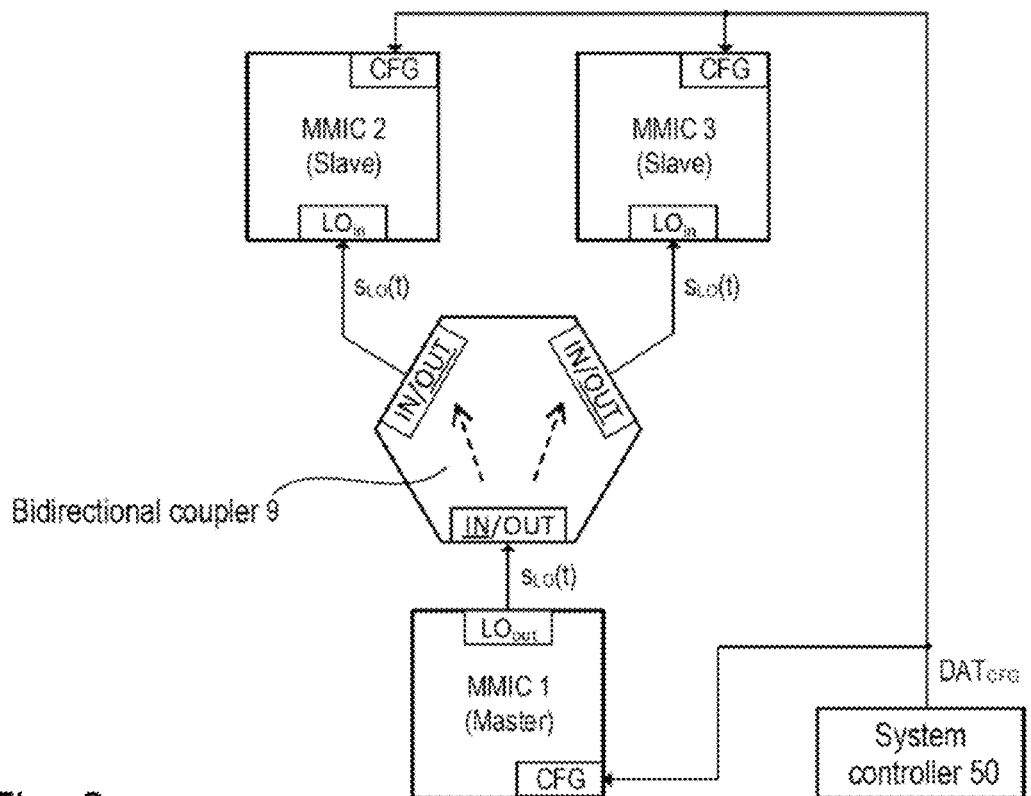
FIG. 6 shows a block diagram of one example of a radar system comprising three (master and slave) MMICs coupled via a bidirectional coupler, wherein the fact of which MMIC has the role of the master MIMIC is configurable by way of a controller.

FIG. 6 shows one example of a configured radar system comprising a plurality of MMICs 1, 2 and 3 arranged on a printed circuit board, and comprising a system controller 50, which is connected to the MMICs 1, 2, and 3 and designed to communicate with the MMICs 1, 2, and 3 via a digital communication interface. In one example implementation, the communication interface is a Serial Peripheral Interface (SPI), but other serial or parallel communication interfaces can also be used. Via the communication interface, the system controller 50 can configure the operating modes (e.g. master mode, slave mode) of the MMICs 1, 2 and 3, which receive configuration data $DAT_{CFG}$ via a configuration input CFG (an SPI interface in the present example) and are operated as master or as slave depending on the received configuration data $DAT_{CFG}$. As in the previous example from FIG. 5, the master MIMIC (the MMIC 1 in FIG. 6) makes the LO signal $s_{LO}(t)$ available at an LO output $LO_{out}$. Said LO output $LO_{out}$ is connected to corresponding LO inputs $LO_{in}$ of the slave MMICs (MMICs 2 and 3 in FIG. 6), at which the LO signal $s_{LO}(t)$ of the master MMIC is fed to the slave MMICs.

In order to distribute the LO signal $s_{LO}(t)$, the MMICs 1, 2 and 3 are connected via a bidirectional coupler 9 (e.g. a passive hybrid coupler such as a rat race coupler, for example). The coupler 9 receives the LO signal $s_{LO}(t)$ of the master MIMIC at one port and distributes said signal between other ports connected to the LO inputs $LO_{in}$ of the slave MMICs. In the present example, the coupler 9 distributes the LO signal $s_{LO}(t)$ between two ports, wherein one half of the power of the LO signal $s_{LO}(t)$ generated by the master MMIC is fed to the slave MMIC 2, and the other half to the slave MIMIC 3. In other words, the LO signal $s_{LO}(t)$ is attenuated by approximately 3 dB in the signal path from the master MIMIC 1 to the slave MIMIC 2 and is likewise attenuated by approximately 3 dB in the signal path from the master MIMIC 1 to the slave MMIC 3. In practical implementations, losses should be taken into consideration and the attenuation is therefore somewhat greater. The use of passive (hybrid) couplers enables a comparatively simple implementation of a bidirectional coupler by means of planar conductor track structures arranged on the carrier printed circuit board, such as e.g. strip lines (micro-strip lines, coplanar lines) and/or waveguides integrated in the substrate of the carrier printed circuit board. In the example illustrated, the MMICs 1, 2 and 3 are connected to the coupler 9 in a kind of star circuit, that is to say that the coupler 9 is the central element, to which the RF contacts (LO inputs of the slave MMICs and the LO output of the master MMIC) are connected. In a star circuit, the LO signal $s_{LO}(t)$ passes from the master MIMIC via the coupler to the slave MMICs. In contrast thereto, e.g. in the case of a chain circuit (a kind of daisy-chain), the LO signal passes from one MIMIC to the next.

Unlike active components (e.g. active electronic switches), purely passive components (such as e.g. passive couplers constructed from strip lines) usually have a lower probability of failure, which may be beneficial with regard to the functional reliability since, depending on the application, it may be necessary to satisfy specific standards with regard to functional reliability (e.g. ISO 26262). Various example implementations of passive bidirectional hybrid couplers are explained in even greater detail further below with reference to FIG. 13.

As mentioned, the coupler 9 is bidirectional. That is to say that each port of the coupler 9 can operate—depending on the signal flow direction—both as input port and as output port. The LO ports of the MMICs are configurable both as LO inputs $LO_{in}$ and as LO outputs $LO_{out}$ by the system controller 50. During normal operation (i.e. in a first operating mode)—as illustrated in FIG. 6—the MMIC 1 is configured as master and the MMICs 2 and 3 are configured as slaves. If, by way of example, the master MMIC 1 is then defective or is no longer operating in accordance with the required, predefined specifications (i.e. is no longer operating properly), the system controller 50 can reconfigure the radar system and change it to "emergency operation" (i.e. a second operating mode), wherein one of the previous slave MMICs (e.g. MMIC 2) takes over the role of master and the previous master MMIC is deactivated. This situation is illustrated in FIG. 7.

Figure 7:
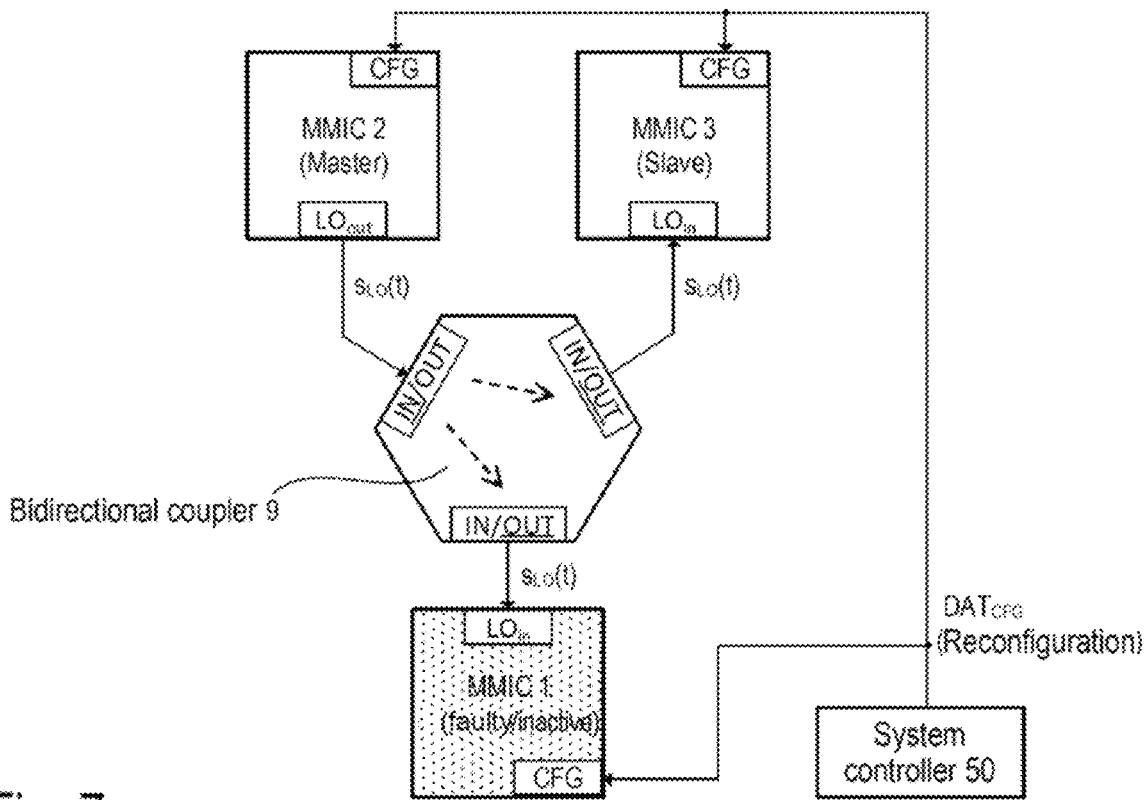
FIG. 7 shows the example from FIG. 6, wherein the system has been reconfigured on account of a defect in the master MIMIC, such that one of the previous slave MMICs takes over the role of the master MMIC, while the previous master MIMIC is inactive.

The example in FIG. 7 shows the radar system from FIG. 6 after a reconfiguration on account of a defective master MIMIC. Accordingly, MIMIC 2 has been configured as master MMIC and now generates the LO signal $s_{LO}(t)$. The external contact $LO_{in}/LO_{out}$, at which the LO signal—depending on the configuration—can be fed in or output, is configured as LO output in this situation and is accordingly designated by $LO_{out}$ in FIG. 7. The configuration of MIMIC 3 in FIG. 7 is the same as in FIG. 6, and MIMIC 1 (the previous master MIMIC) has been deactivated. Since the coupler 9 can be operated bidirectionally, no reconfiguration of the coupler 9 or alteration of the coupling to the RF contacts at the MMICs is necessary. In the example illustrated in FIG. 7, the LO signal $s_{LO}(t)$ is fed to that port of the coupler 9 which is connected to MMIC 2, and the signal power is distributed between the other ports. The signal flow direction through the coupler 9 is indicated by the dashed arrows.

In the example illustrated in FIGS. 6 and 7, only the components that are used for the distribution of the LO signal are depicted, in order to keep the illustration simple. It goes without saying that each of the MMICs 1, 2 and 3 additionally comprises one or more RX and TX channels that can be coupled to corresponding RX and TX antennas (cf. FIGS. 4 and 5). In the case of a statically configured system (such as e.g. the example in FIG. 5), the master MMIC represents a so-called "Single Point of Failure" (SPOF), upon the failure of which the entire radar system fails. The reconfiguration, as illustrated in the example from FIGS. 6 and 7, makes it possible to replace a defective/inactive master MMIC by means of a slave MIMIC taking over the role of master and generating the LO signal. The distribution of the system clock signal $s_{CLK}(t)$ is not illustrated in the example from FIGS. 6 and 7. However, the clock signal $s_{CLK}(t)$ can be distributed in a similar manner to the LO signal. Since the frequency of the clock signal $s_{CLK}(t)$ is much lower (e.g. 50-200 MHz), an RF coupler is generally not necessary to distribute the clock signal to the slave MMICs (cf. FIG. 5). If the master MMIC fails in such a way that it cannot generate a clock signal, a slave MMIC can be reconfigured for the generation of a clock signal. It should be noted at this juncture that the LO signal of master MMIC $s_{LO}(t)$ and the clock signal $s_{CLK}(t)$ need not necessarily be generated in the same MMIC. A defective/inactive master MIMIC that can no longer generate an LO signal could—depending on the type of defect—nevertheless generate a clock signal $s_{CLK}(t)$ for the other MMICs. In this respect, the terms "master" and "slave" relate only to the generation of the LO signal $s_{LO}(t)$.

Figure 8:
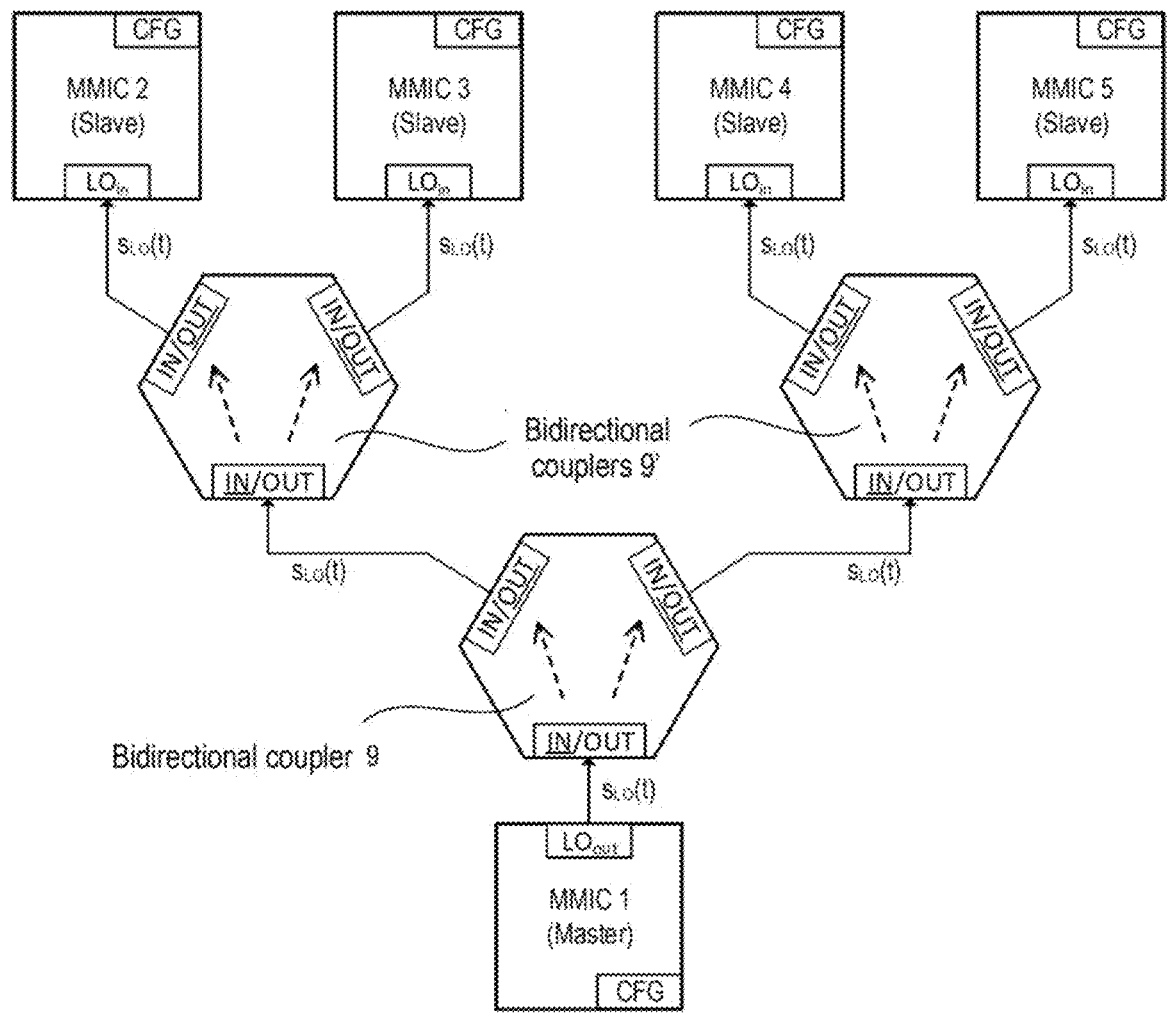
FIG. 8 shows a block diagram of a further example of a radar system, in which four slave MMICs are connected to a master MIMIC via cascaded couplers.

The example illustrated in FIG. 6 can be cascaded as illustrated in FIG. 8. In accordance with the example from FIG. 8, the LO signal is distributed via a two-stage coupler arrangement comprising a plurality of couplers 9, 9'. In the first stage, the coupler 9 distributes the LO signal $s_{LO}(t)$ received from the master MMIC 1 between the couplers 9' of the second stage, and the couplers 9' distribute the LO signal $s_{LO}(t)$ received from the coupler 9 of the first stage among the slave MMICs 2, 3, 4 and 5. As in the previous example from FIG. 6, the couplers 9 and 9' are bidirectional couplers and can be implemented e.g. by means of strip lines on the carrier printed circuit board PCB (not illustrated in FIGS. 8 and 9). The signal flow direction through the couplers 9, 9' is indicated by dashed arrows in FIG. 8. Since the couplers 9, 9' split the power of the LO signal $s_{LO}(t)$ arriving at one port between the other two ports, the attenuation in each stage is at least 3 dB. This is a theoretical minimum value. In practical implementations, the actual attenuation is greater on account of losses and line damping. In this example, too, the MMICs are arranged in star form with respect to the coupler arrangement (star circuit/star-shaped topology).

Figure 9:
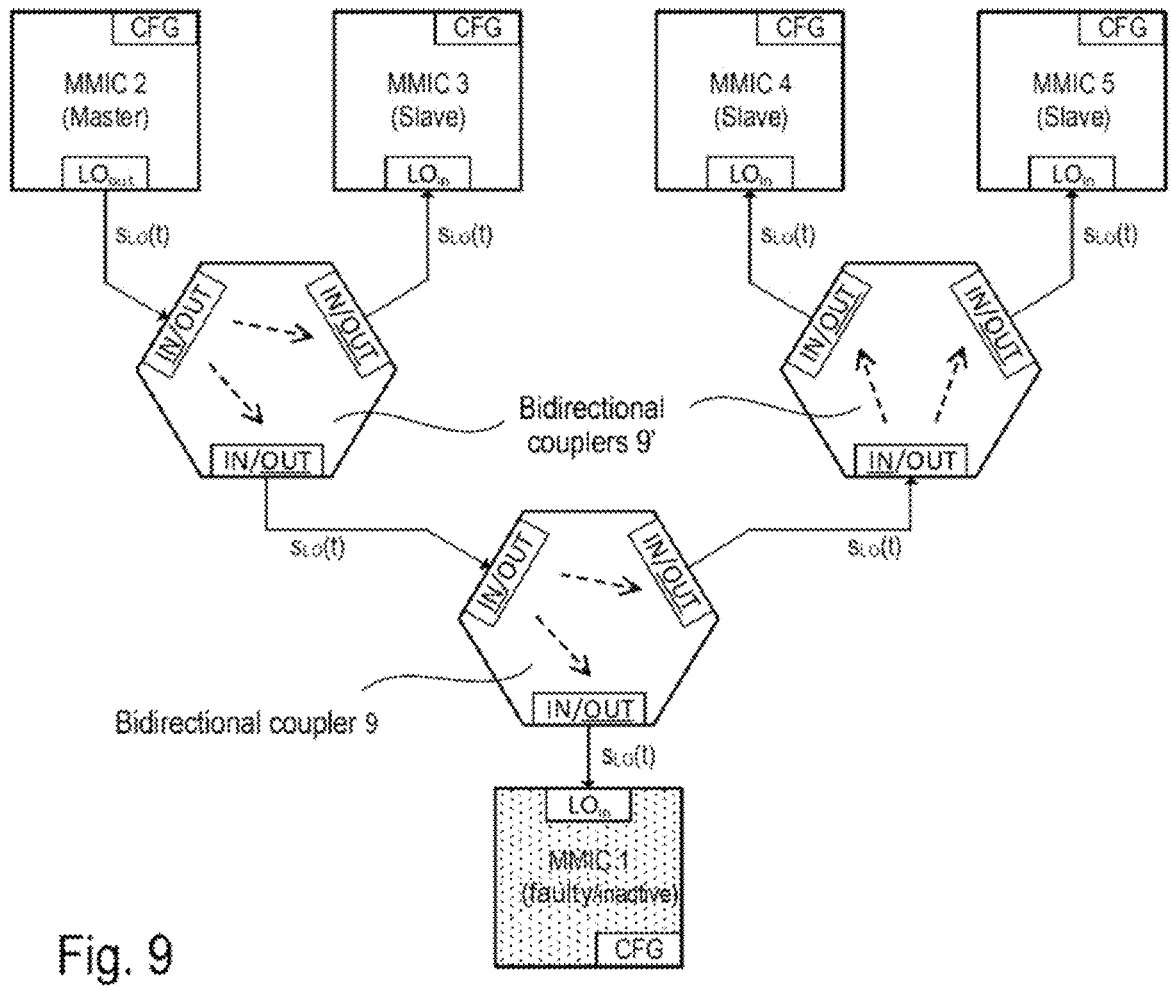
FIG. 9 shows the system from FIG. 8, wherein the system has been reconfigured on account of a defect in the master MIMIC, such that one of the previous slave MMICs takes over the role of the master MMIC, while the previous master MIMIC is inactive.

FIG. 9 illustrates a situation in which the system in accordance with FIG. 8 has been reconfigured on account of a defective master MMIC. Accordingly, MMIC 1 is inactive/deactivated and the previous slave MMIC 2 is configured as master MIMIC and therefore makes the LO signal available at the external contact $LO_{out}$ configured as LO output. As already explained above with reference to FIG. 7, the external LO input $LO_{in}$ can be reconfigured as LO output $LO_{out}$. In this situation, the coupler 9' (shown on the left in FIG. 9) receives the LO signal $s_{LO}(t)$ from the "new" master MMIC 2 and distributes said LO signal to the slave MIMIC 3 and the coupler 9 of the first stage. Said coupler 9 distributes the LO signal further to the other coupler 9' (shown on the right in FIG. 9) of the second stage, which in turn distributes the LO signal further to the slave MMICs 4 and 5. The signal flow direction through the couplers 9, 9' is represented by the dashed arrows in FIG. 9.

As mentioned, in the examples in accordance with FIGS. 6-9, the MMICs are designed to operate both in a master mode and in a slave mode depending on the configuration data $DAT_{CFG}$ received from the system controller 50 (see FIG. 6, not shown in FIGS. 8-9). Each MMIC includes a local oscillator (cf. FIG. 4, local oscillator 101), which, however, is in operation only in the master mode and is inactive in the slave mode. In the master mode, an external contact of the MMIC is configured as LO output $LO_{out}$, at which the LO signal is output (e.g. to the coupler 9). In the slave mode, the same external contact is configured as LO input $LO_{in}$ and the local oscillator is deactivated; a slave MIMIC receives the LO signal from the master MMIC at the external contact configured as LO input $LO_{in}$.

Figure 10:
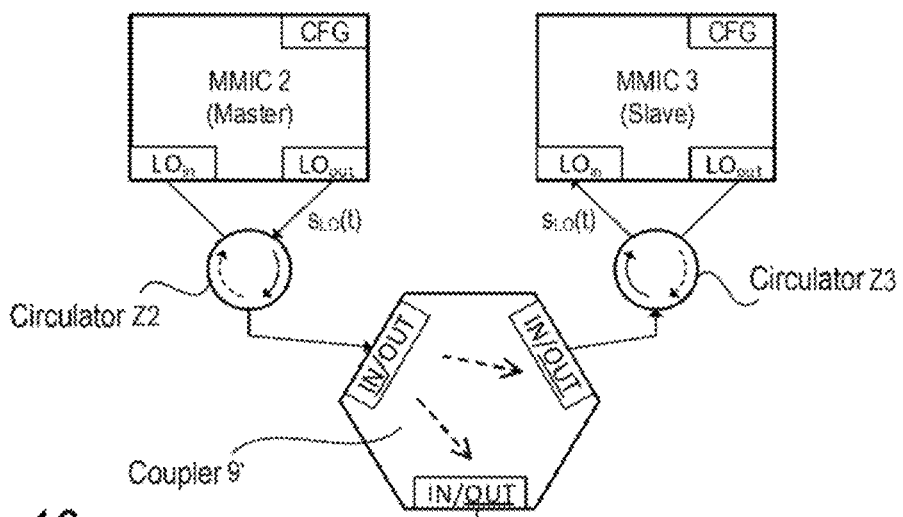
FIG. 10 illustrates a modification of the example from FIG. 9.

In the examples illustrated above, an external RF contact was able to be configured either as LO output $LO_{out}$ (in the master mode) or as LO input (in the slave mode). In the example illustrated in FIG. 10, which shows a modification of the example from FIG. 9, this configurability of the RF contacts of the MMICs (MMICs 2 and 3 in the example illustrated) is not necessary since two separate contacts are provided, of which one serves as LO input and one serves as LO output. In this case, only the LO output $LO_{out}$ is active in the master mode and only the LO input $LO_{in}$ is active in the slave mode. In this case, the external contacts $LO_{in}$, $LO_{out}$ of the MMICs 2 and 3 are connected to the bidirectional hybrid coupler 9' via circulators 9". The illustrated situation corresponds to that from FIG. 9, wherein MIMIC 2 is configured as master MMIC and generates the LO signal $s_{LO}(t)$ and provides it at the LO output $LO_{out}$. The LO output $LO_{out}$ of the MMIC 2 is connected to the circulator Z2, which forwards the LO signal $s_{LO}(t)$ to the coupler 9'. The coupler 9' forwards the LO signal to the circulator Z3, which in turn feeds said LO signal to the LO input $LO_{in}$ of the MMIC 3 configured as a slave. The combination of MIMIC and circulator as illustrated in FIG. 10 can be used in all the example implementations described here if the MMICs do not comprise an external RF contact configurable as LO input and LO output. Instead of (passive) circulators, active components such as e.g. electronic switches can also be used.

In the example implementations shown above, the master MIMIC comprises an RF contact configured as LO output $LO_{out}$, wherein the master MMIC and the slave MMICs are connected by means of a coupler arrangement in a type of star circuit (star connection, Y-connection) (star-shaped topology). In the example from FIGS. 6 and 7, the coupler arrangement includes the coupler 9. In the example from FIGS. 8 and 9, the coupler arrangement includes the coupler 9 in the first distributor stage and two couplers 9' in the second distributor stage in order to distribute the LO signal $s_{LO}(t)$ of the master MIMIC 1 among four slave MMICs 2, 3, 4, 5. A multi-stage coupler arrangement leads to a higher transmission loss. In the example illustrated in FIG. 10, the coupler arrangement also comprises a circulator for each slave MMIC, which likewise increases the transmission loss and makes the implementation more complex. In the example illustrated in FIGS. 11 and 12, the MMIC 1, initially configured as master, comprises two RF contacts configured as LO outputs $LO_{out}$, wherein a coupler 9 is connected to each of the two LO outputs $LO_{out}$.

Figure 11:
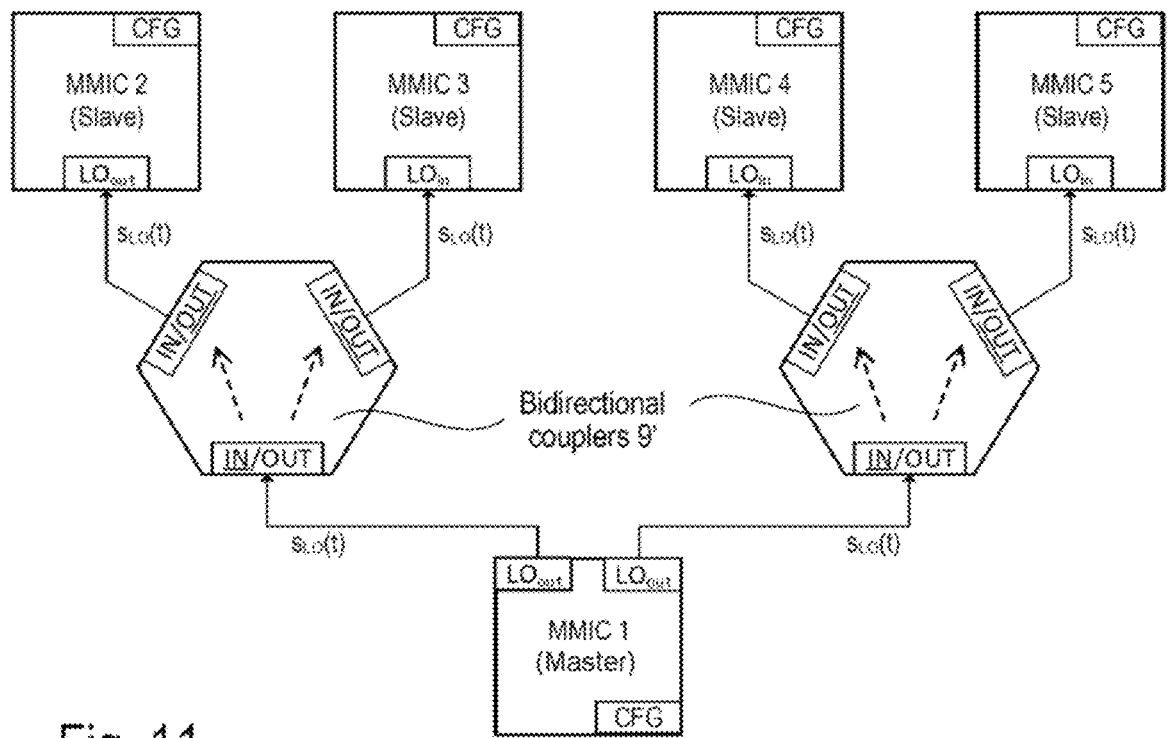
FIG. 11 shows a modification of the example from FIG. 8, wherein a coupler is replaced by virtue of the master MIMIC comprising two RF contacts configured as output.
Figure 12:
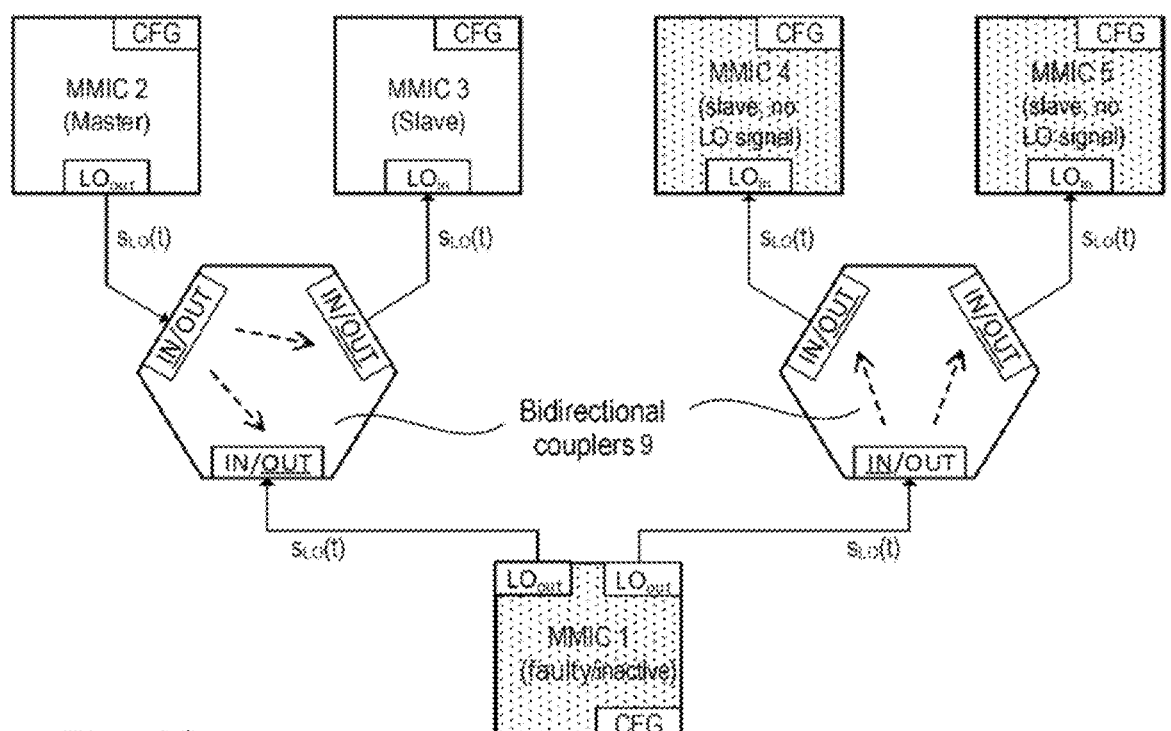
FIG. 12 shows the system from FIG. 11, wherein the system has been reconfigured on account of a defect in the master MIMIC, such that one of the previous slave MMICs takes over the role of the master MMIC, while the previous master MIMIC is inactive.

The system illustrated in FIG. 11 can be considered to be composed of two subsystems, wherein the two subsystems are substantially constructed like the example from FIG. 6 and the master MMIC is the master for both subsystems. In normal operation (first operating mode) all five MMICs 1-5 are active. If the master MIMIC 1 is no longer operating properly and can no longer generate LO signals $s_{LO}(t)$ corresponding to the desired specifications, it is possible to change to "emergency operation" (second operating mode) by the master MIMIC 1 being deactivated (by means of the system controller 50, see FIG. 6 or 14) and a slave MIMIC in one of the subsystems being configured as new master MMIC. This situation is illustrated in FIG. 12, in which the MMIC 2 has been configured as new master MMIC, while the previous master MIMIC 1 is inactive. It goes without saying that in the case of the arrangement illustrated in FIGS. 11 and 12, in the second operating mode, only that subsystem in which the new master MMIC 2 is situated can be active. The MMICs 4 and 5 in the other subsystem no longer receive an LO signal—unlike in the example from FIG. 9.

As an extension to the example illustrated in FIG. 12, in a further example implementation, in the second operating mode (emergency operation), in each of the subsystems a slave MIMIC can be configured as new master MMIC. In this case, not only the MIMIC 2 but also e.g. the MIMIC 4 would be configured as master MIMIC and the MMICs in both subsystems can continue to be operated even if the previous master MMIC 1 is defective/inactive. However, in this case, the LO signals in the two subsystems are no longer coherent which entails limitations for some evaluations (e.g. when ascertaining the DoA).

Figure 13:
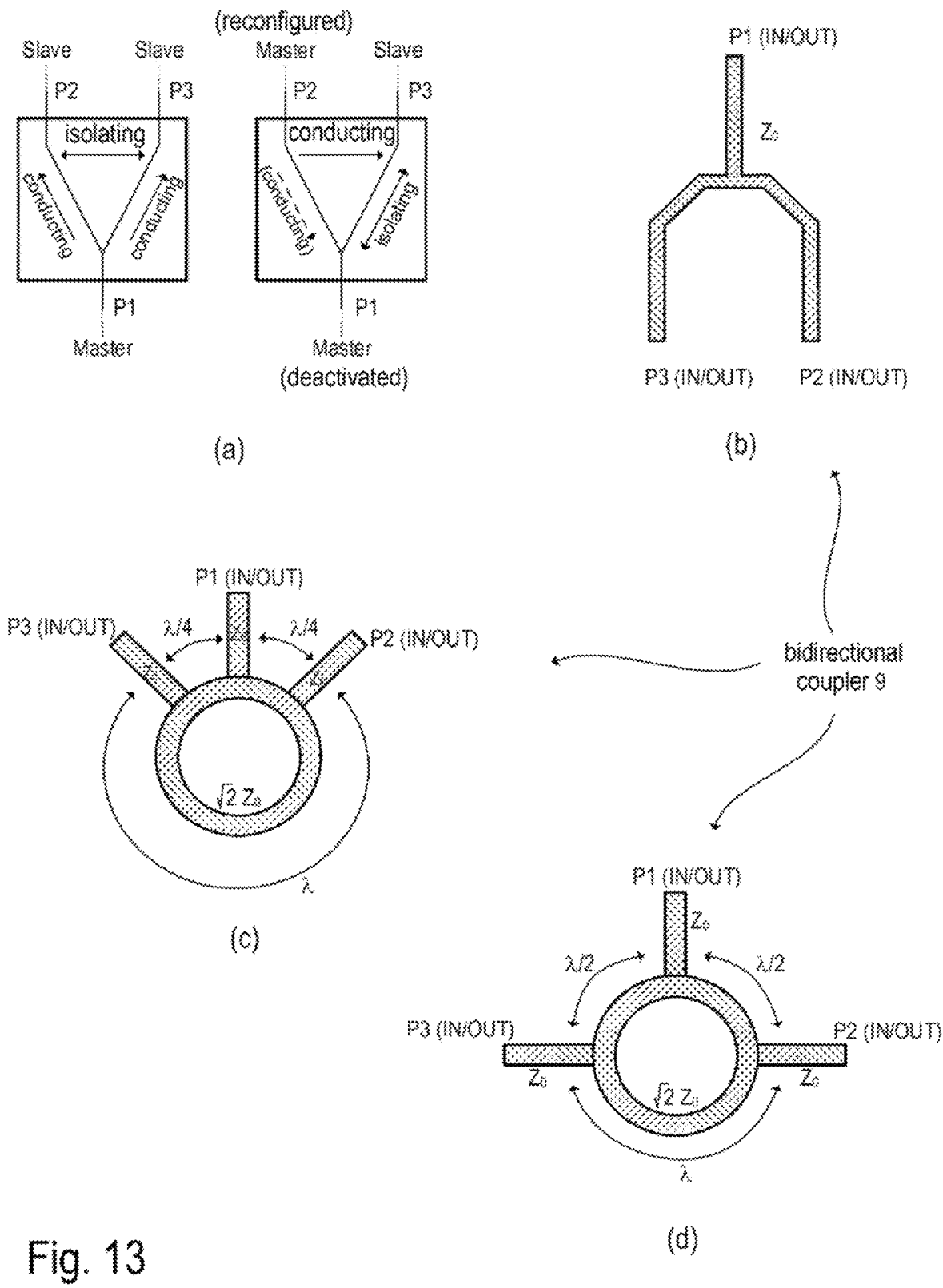
FIG. 13 shows example implementations of passive bidirectional couplers that can be used in the examples from FIGS. 6-9.

FIG. 13 illustrates a plurality of examples of passive bidirectional couplers (hybrid couplers) which can be used in the implementation of the radar systems from FIGS. 6 and 8. Diagram (a) from FIG. 13 shows, on the basis of a schematic diagram, two configurations of the connected MMICs, in which the signal flow direction is different. The coupler illustrated on the left in diagram (a) shows the situation from FIG. 6, in which the LO signal from the master MMIC is passed through from the port P1 to the ports P2 and P3. The coupler illustrated on the right in diagram (a) shows the situation from FIG. 7, in which the previous master MIMIC is deactivated and a slave MIMIC has been configured as new master MMIC. In this case, the LO signal is passed through from the port P2 to the ports P3 and P1. Diagram (a) in FIG. 13 illustrates an ideal case. In practice, couplers having a high degree of isolation between two ports are not bidirectional and can only be operated as unidirectional splitters (cf. FIG. 5, splitter 8) which have a dedicated input and two dedicated outputs and in which the signal flow direction is not reversible. In the example implementations described here, use is made of couplers which can have a higher transmission loss and a poorer isolation than power splitters, but in return can be operated bidirectionally.

The coupler illustrated in diagram (b) in FIG. 13 is often referred to as a T-junction coupler. The latter has values for transmission loss and isolation that are similar for all signal flow directions. Other coupler structures such as e.g. the ring coupler (rat race coupler) illustrated in diagram (c) in FIG. 13 have better values for transmission loss and isolation in the case of an LO signal arriving at the port P1 (situation from FIG. 6) by comparison with a situation (see FIG. 7) in which the LO signal arrives at the port P2. Since the first case (situation from FIG. 6) represents "normal operation", the abovementioned asymmetry of the ring coupler can be expedient since it yields a better performance than the symmetrical T-junction coupler in normal operation. The poorer performance is accepted in the case of a fault (situation from FIG. 7 or 12). Diagram (d) in FIG. 13 shows a further ring coupler, which—in a manner similar to the T-junction coupler—has values for transmission loss and isolation that are similar for all signal flow directions. In the diagrams in FIG. 13, $Z_0$ denotes the characteristic impedance of the lines. The coupler structures illustrated in FIG. 13 and their mode of operation are known per se and therefore will not be described in greater detail here.

The example implementations described above are suitable for reconfiguring the radar system if the MMIC configured as master is defective, i.e. is no longer operating in accordance with desired, predefined specifications (i.e. is no longer operating properly). A defect can have various causes. In accordance with the example implementation illustrated in FIG. 14, the MMICs have self-test functions, and the MMICs 1, 2, 3 are designed to output a status signal $OK_1$, $OK_2$, $OK_3$ at a status output OK, said status signal indicating whether the respective MMIC is operating in line with the desired specifications (i.e. properly). The status signals $OK_1$, $OK_2$, $OK_3$ are fed to the controller 50, which can identify on the basis of the status signals $OK_1$, $OK_2$, $OK_3$ whether an MMIC is defective (not operating in accordance with the desired specifications) and the radar system is to be reconfigured owing to a defect. Apart from the status outputs OK and the associated status signals $OK_1$, $OK_2$, $OK_3$, the system from FIG. 14 corresponds to the previous example from FIG. 6 and reference is made to the explanations in this regard above.

The radar MMICs used in the example implementations described here can have self-test and diagnosis functions. These functions can serve, for example, to monitor various operating parameters of the MMICs, such as e.g. the characteristic of the phase noise of the local oscillator, the current consumption, the presence of the system clock and further operating parameters which are monitored in order to ensure functional reliability with regard to the ISO 26262 standard.

Figure 15:
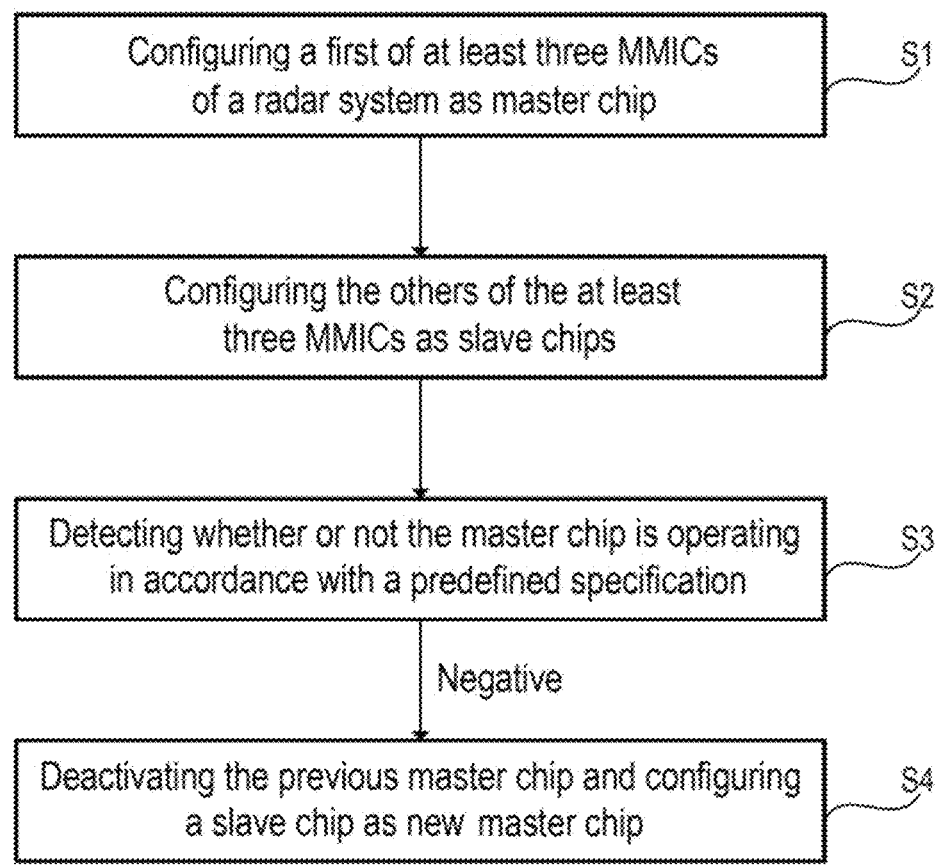
FIG. 15 illustrates one example of a method for operating a radar system.

FIG. 15 illustrates, in a flow diagram, one example of a method for operating a radar system, such that a Single Point of Failure can be avoided. In this case, the radar system comprises at least three MMICs (radar chips) as illustrated e.g. in FIG. 6. In this case, the MMICs comprise external RF contacts coupled via a coupler arrangement. In accordance with the flow diagram illustrated, the method comprises configuring a first of the at least three MMICs as master chip (see FIG. 15, block S1) and configuring the other radar chips as slave chips (see FIG. 15, block S2). In this case, the configuring as master MIMIC comprises configuring the respective RF contact as RF output, at which the master MMIC outputs the local oscillator signal $s_{LO}(t)$, which is distributed via the coupler arrangement to the slave MMICs. The configuring as slave MIMIC comprises configuring the respective RF contact as RF input, at which the local oscillator signal $s_{LO}(t)$ is received from the coupler arrangement. One example of such a configuration is shown in FIG. 6 (cf. FIG. 6, master MIMIC 1, slave MMICs 2 and 3).

The method further comprises detecting whether or not the master MMIC is operating in accordance with a predefined specification (see FIG. 15, block S3). In the case of a negative result (i.e. the master MMIC is not operating in accordance with the predefined specification), the method includes the reconfiguration of the radar system, wherein the previous master MMIC is deactivated and one of the slave MMICs is reconfigured as "new" master MMIC (see FIG. 15, block S4). One example of the result of this reconfiguration is illustrated in FIG. 7.

Figure 16A:
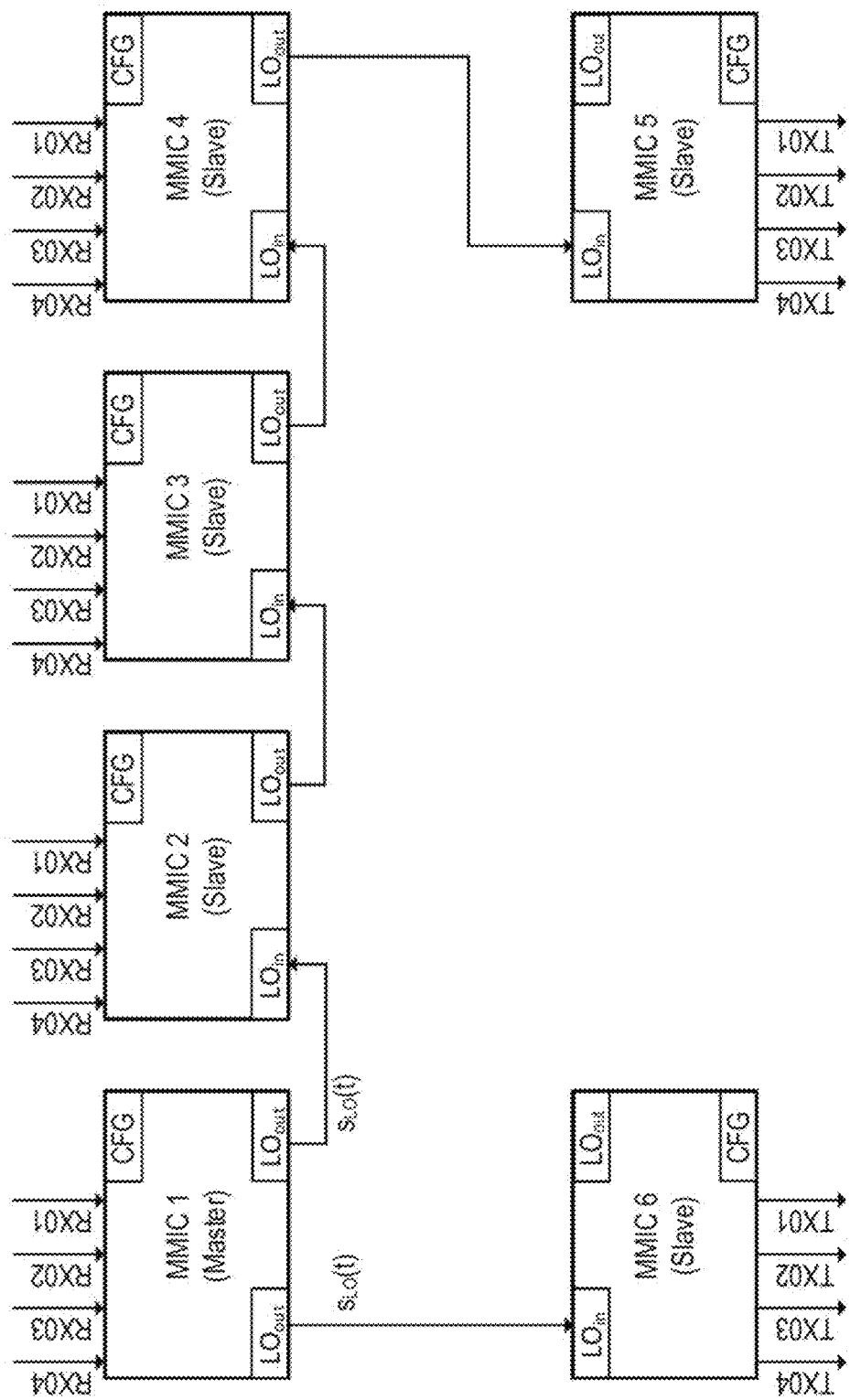
Figure 16B:
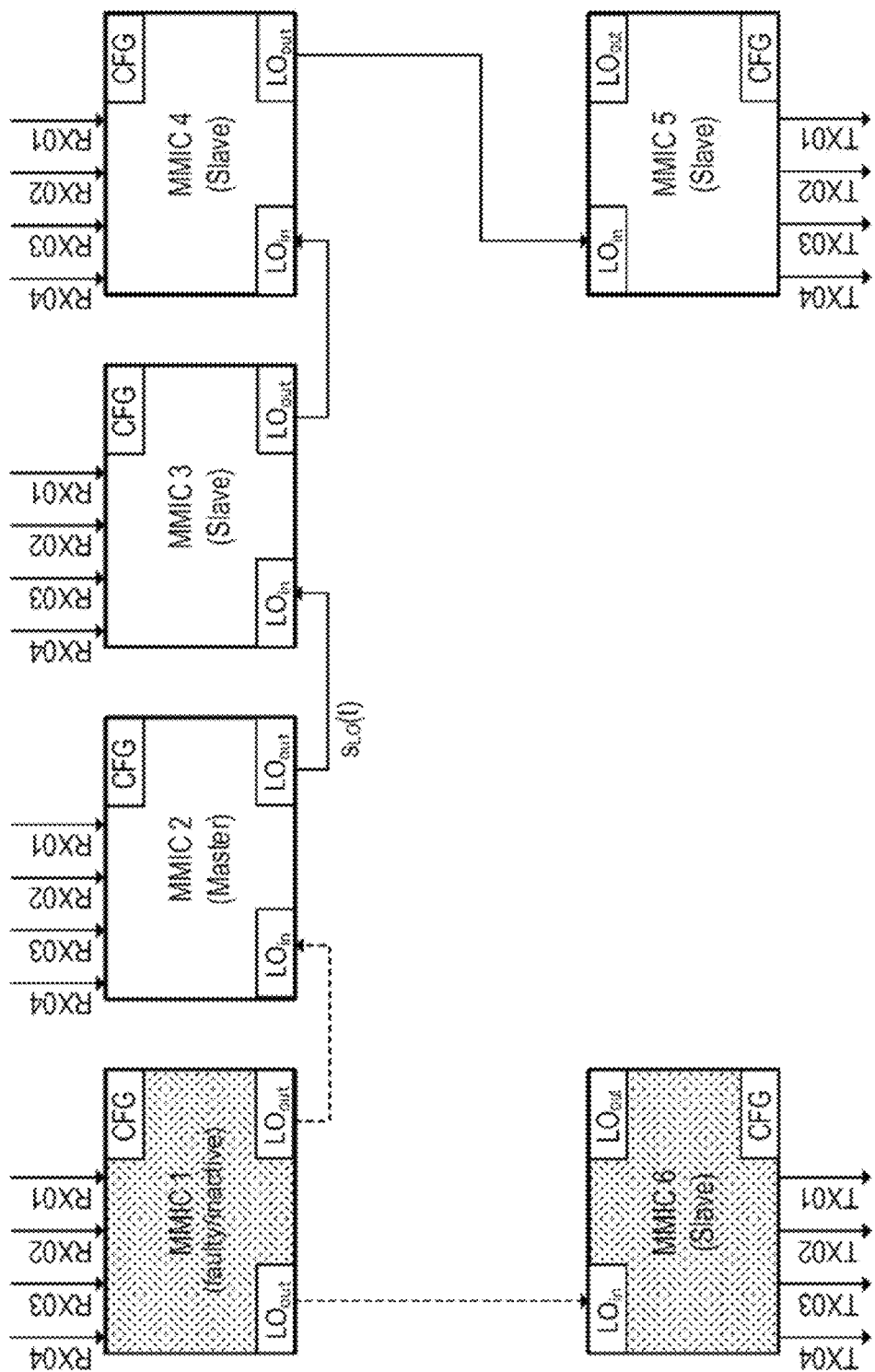
Figure 16C:
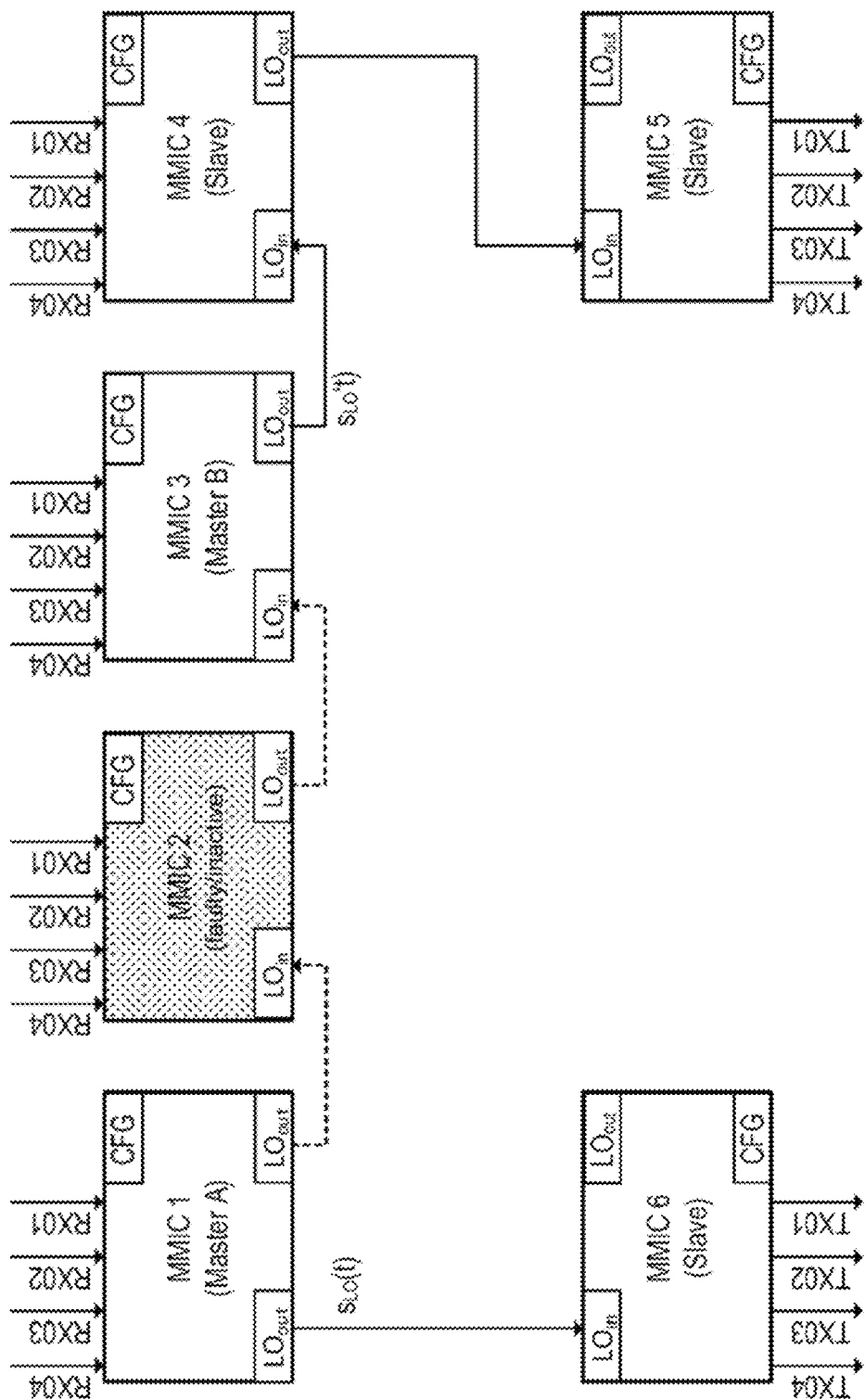
Figure 16D:
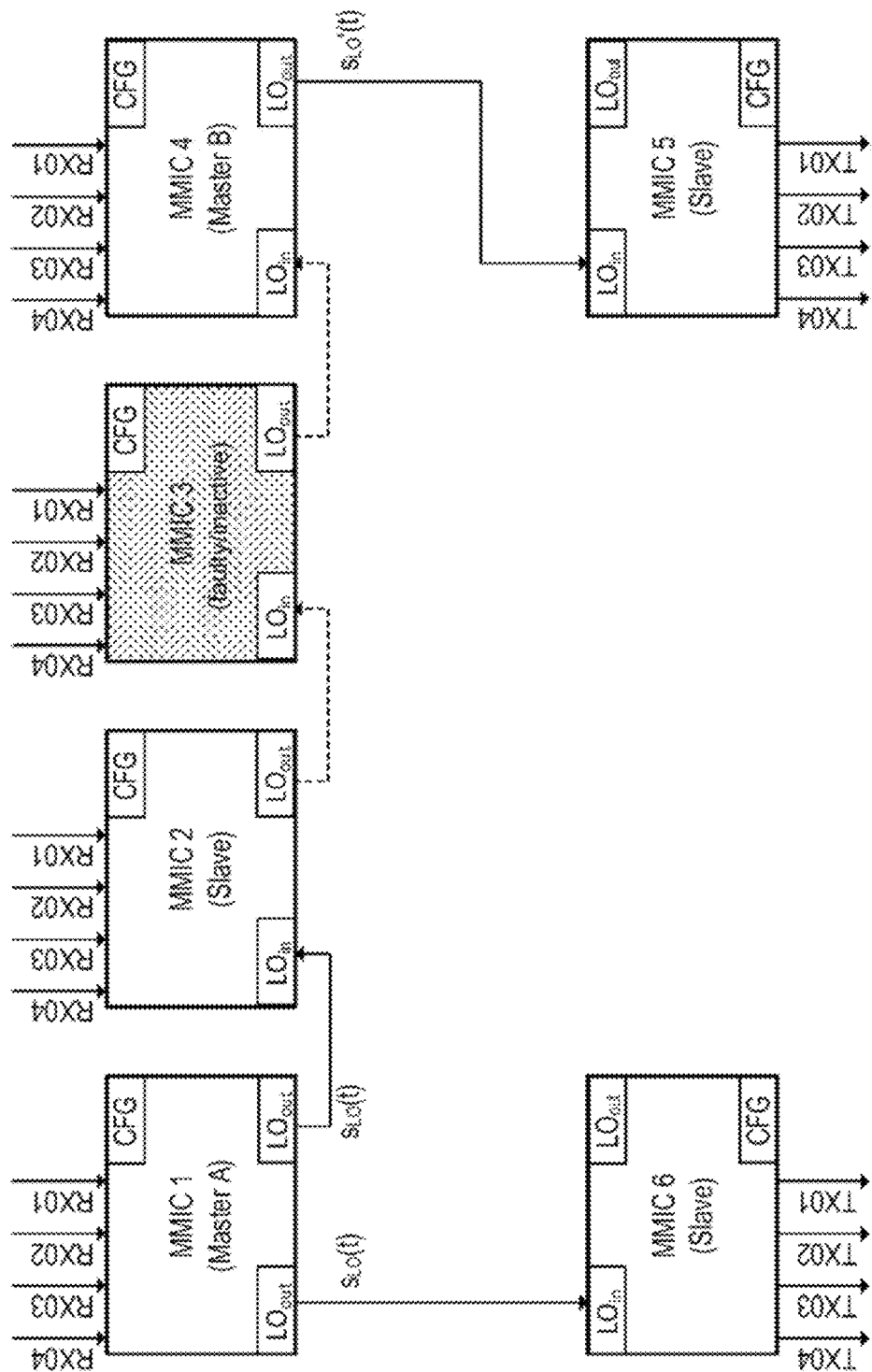

FIGS. 16A-16D contain block diagrams for illustrating a further example of a radar system comprising cascaded radar MMICs, wherein FIG. 16A illustrates the system with six functional MMICs, and FIGS. 16B, 16C and 16D illustrate the same system with in each case one defective MMIC or MMIC configured as inactive. The MMICs 1, 2, 3, 4, 5 and 6 can be constructed substantially identically to the MMICs in the previous examples (see e.g. FIG. 6), wherein the controller 50 is not illustrated for the sake of clarity. In the situation illustrated in FIG. 16A, the slave MMICs 2, 3, 4, 5 and 6 can each have an LO input $LO_{in}$ and an LO output $LO_{out}$, while the master MMIC 1 can have two LO outputs $LO_{out}$. In this case, the LO signal $s_{LO}(t)$ is already split between the two LO outputs $LO_{out}$ in the master MMIC 1.

In the case illustrated in FIG. 16A, the MMICs 1, 2, 3 and 4 each comprise four RX channels RX01, RX02, RX03 and RX04, to each of which is fed an antenna signal from a receiving antenna. The MMICs 5 and 6 each comprise four TX channels TX01, TX02, TX03 and TX04. The spatial separation illustrated in FIG. 16A by virtue of RX and TX channels being arranged on different MMICs may be desirable in some applications, but is not necessary in all applications. That is to say that it is also possible to use MMICs (master and/or slave) having RX and TX channels in one silicon chip. It should be noted at this juncture that the number and division of RX and TX channels as illustrated in FIGS. 16A to 16D are purely by way of example and other divisions are possible in other example implementations.

For the operation of the radar system, it is beneficial for the LO signals used by the MMICs to be coherent (i.e. to have a defined phase relationship with one another). Therefore, the LO signal is generated in one MIMIC—the master MMIC 1—and distributed to the slave MMICs 2-6. In the example illustrated, for this purpose, the LO signal $s_{LO}(t)$ is transferred from a first LO output $LO_{out}$ of the master MIMIC 1 via an RF line to the LO input $LO_{in}$ of the slave MMIC 2. In the slave MIMIC 2, the received LO signal is distributed to the RX channels RX01, RX02, RX03 and RX04 of the MMIC 2, output again at the LO output $LO_{out}$ and transferred further to the LO input $LO_{in}$ of the slave MIMIC 3. In the slave MMIC 3, the received LO signal is distributed to the RX channels RX01, RX02, RX03 and RX04 of the MMIC 3, output again at the LO output $LO_{out}$ and transferred further to the LO input $LO_{in}$ of the slave MMIC 4. Equally, in the slave MIMIC 4, the received LO signal is distributed in the chip to the RX channels RX01, RX02, RX03 and RX04 of the MMIC 4, output again at the LO output $LO_{out}$ and transferred further to the LO input $LO_{in}$ of the slave MIMIC 5. In the slave MMIC 5, the received LO signal is distributed to the TX channels TX01, TX02, TX03 and TX04 and emitted via the associated antennas (not illustrated in FIGS. 16A-16D). The slave MMICs 2-5 are thus coupled to one another in a series circuit with regard to the distribution of the LO signal.

In the master MIMIC 1, the LO signal $s_{LO}(t)$ is also output at a second LO output and the LO signal $s_{LO}(t)$ is transferred toward the LO input $LO_{in}$ of the slave MMIC 6. The slave MMIC 6 can be constructed substantially identically to the slave MIMIC 5. The distribution of the system clock signal $s_{CLK}(t)$ is not illustrated in the example from FIGS. 16A-16D. However, the clock signal $s_{CLK}(t)$ can be distributed in a similar manner to the LO signal $s_{LO}(t)$ (cf. FIG. 5 and the associated explanations).

As in the example from FIG. 6, the system controller 50 can configure the operating modes (e.g. master mode, slave mode) of the MMICs 1-6, wherein the MMICs 1-6 receive configuration data via the configuration input CFG (e.g. an SPI interface) and are operated as master (in the master mode) or as slave (in the slave mode) depending on the received configuration data. In this context, reference is also made to the explanations concerning FIGS. 6 and 14.

In the case illustrated in FIG. 16A, the radar system comprises a total of sixteen RX channels (with sixteen RX antennas) and eight TX channels (with eight TX antennas), which enables comparatively high-resolution radar operation. This operation corresponds to operation in the first operating mode (normal operation) already mentioned further above. The examples from FIGS. 16B-D show how the radar system can be reconfigured and continue to be operated in a restricted manner in a second, third and fourth operating mode (emergency operation) if an MMIC (in particular the master MIMIC 1) fails.

In the situation illustrated in FIG. 16B, the (master) MMIC 1 is configured as inactive, e.g. on account of a defect or a failure, and therefore can no longer generate the LO signal $s_{LO}(t)$ (or no longer generate it with the desired quality or reliability). Once the controller 50 (not illustrated in FIGS. 16A-16D) has detected that MIMIC 1 is to be configured as inactive, e.g. the MIMIC 2 can be reconfigured in such a way that it is operated as master MMIC (i.e. in the master mode). As a result, the local oscillator in the MMIC 2 is activated and the LO signal $s_{LO}(t)$ is output by the new master MMIC 2 at the LO output $LO_{out}$ and transferred to the LO input $LO_{in}$ of the MIMIC 3. From the MIMIC 3—as in the situation from FIG. 16A—the LO signal is forwarded via a series circuit to the MMICs 4 and 5 (e.g. in a manner similar to a daisy chain). In the example illustrated, although the MMIC 6 is not defective, it is "cut off" from the LO distribution and therefore cannot transmit. Although the original master MMIC 1 and thus indirectly also the slave MIMIC 6 are inactive, a subsystem including the MMICs 2, 3, 4 and 5 having four (out of eight) TX channels and twelve (out of sixteen) RX channels nevertheless remains functional; radar targets can still be detected—albeit with reduced resolution.

In the situation illustrated in FIG. 16C, the (slave) MIMIC 2 is defective or has failed and can no longer pass the LO signal $s_{LO}(t)$ to the MIMIC 3. Once the controller 50 (not illustrated in FIGS. 16A-16D) has detected that MMIC 2 is to be configured as inactive (e.g. on account of an identified defect), e.g. the MMIC 3 can be reconfigured, such that it is operated as master MMIC (i.e. in the master mode). In this case, the radar system "decomposes" into two mutually independent subsystems, wherein each of the two subsystems comprises a dedicated master MIMIC. The subsystem A comprises the previous master MIMIC 1 (master A) and the slave MIMIC 6 having a total of four RX channels and four TX channels. The subsystem B comprises the new, additional master MMIC 3 (master B), which now generates the LO signal $s_{LO}'(t)$ and transfers it to the slave MIMIC 4 (and the latter transfers it further to the slave MMIC 5). The subsystem B comprises eight RX channels and four TX channels. The LO signal $s_{LO}(t)$ generated by the master MIMIC 1 (master A) and the LO signal $s_{LO}'(t)$ generated by the additional master MMIC 3 (master B) are not coherent and can operate in different frequency ranges. In other words, the radar subsystems A and B operate independently of one another. Nevertheless, the measurement results of the two subsystems A and B can be combined and processed jointly, as is done for example in the case of sensor fusion.

In the situation illustrated in FIG. 16D, the (slave) MIMIC 3 is configured as inactive (e.g. on account of an identified defect) and can no longer pass the LO signal $s_{LO}(t)$ on to the MMIC 4. In a manner similar to the MMIC in the previous example from FIG. 16C, the MMIC 4 can be reconfigured such that it operates as additional master MMIC (master B). The previous master MMIC 1 (master B) can continue to be operated independently thereof. As in the previous example, the radar system "decomposes" into two mutually independent subsystems. The subsystem A comprises the previous master MMIC 1 (master A), the slave MMIC 2 and the slave MMIC 6 having a total of eight RX channels and four TX channels. The subsystem B comprises the new, additional master MMIC 4 (master B), which now generates the LO signal $s_{LO}'(t)$ and transfers it to the slave MMIC 5. The subsystem B thus has four RX channels and four TX channels.

If (proceeding from a fully functional system in accordance with FIG. 16A) one of the slave MMICs 5 or 6 fails, a reconfiguration of a slave MMIC as master MIMIC is not necessary and the system can continue to be operated with sixteen RX channels and four TX channels. It should be noted at this juncture that the concept explained with reference to FIG. 16A, in accordance with which the LO signal $s_{LO}(t)$ is transferred further from one MMIC to the next MMIC (in a manner similar to a daisy chain), is already possible with three MMICs. If the central MMIC of the MMIC chain fails, the two "outer" MMICs of the MIMIC chain can continue to operate as independent subsystems. Furthermore, it should also be noted that the LO signal is distributed asymmetrically in the fully functional system in accordance with FIG. 16A since one LO output of the master MMIC 1 is serially coupled in each case to four MMICs 2-5, while the other LO output of the master MMIC 1 is coupled to only one MMIC 6. Consequently, different TX channels have different phases on account of different lengths of the LO signal distribution. Likewise, different RX channels have different phases on account of different lengths of the RF signal lines in the LO signal distribution.

Figure 17A:
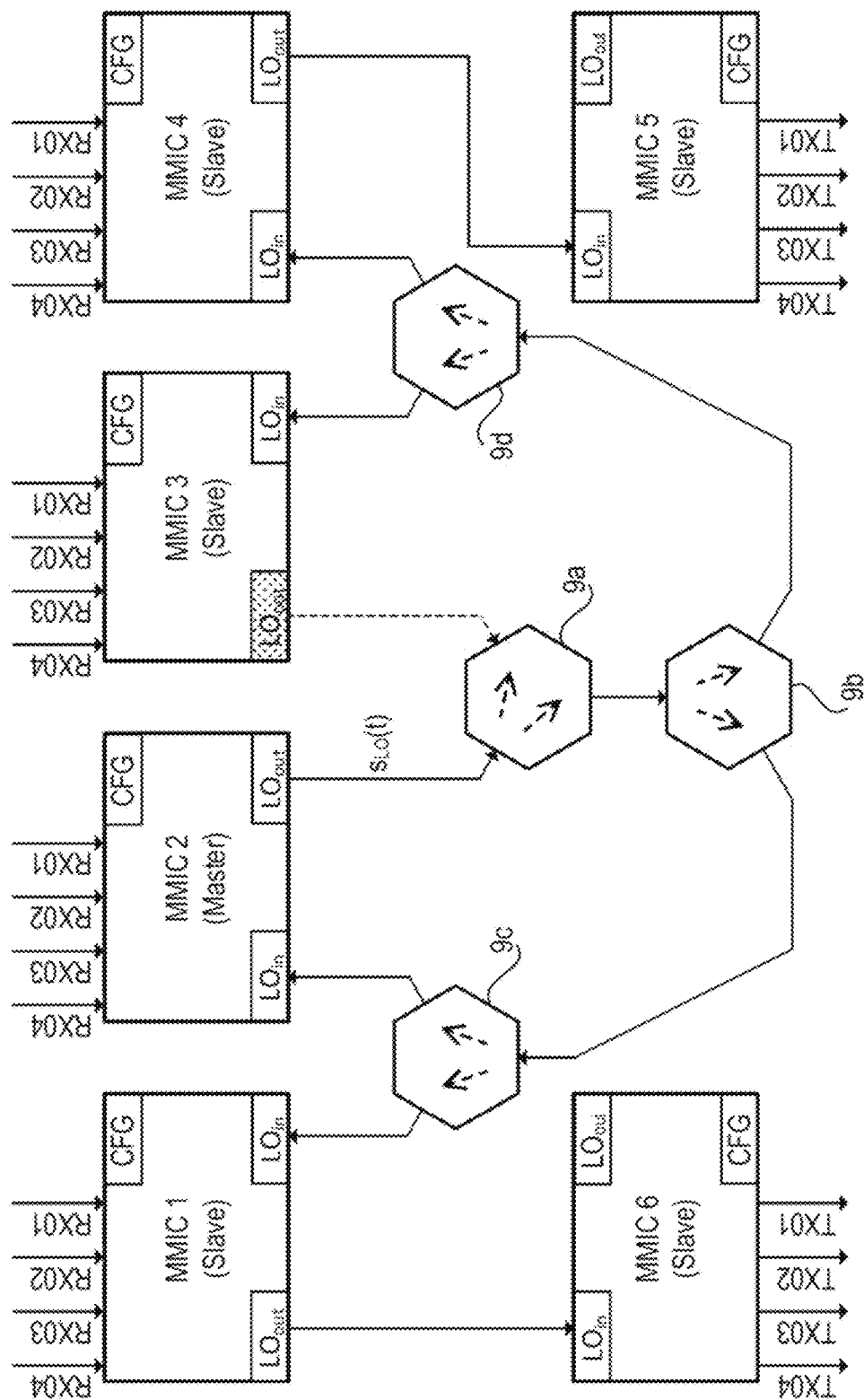
Figure 17B:
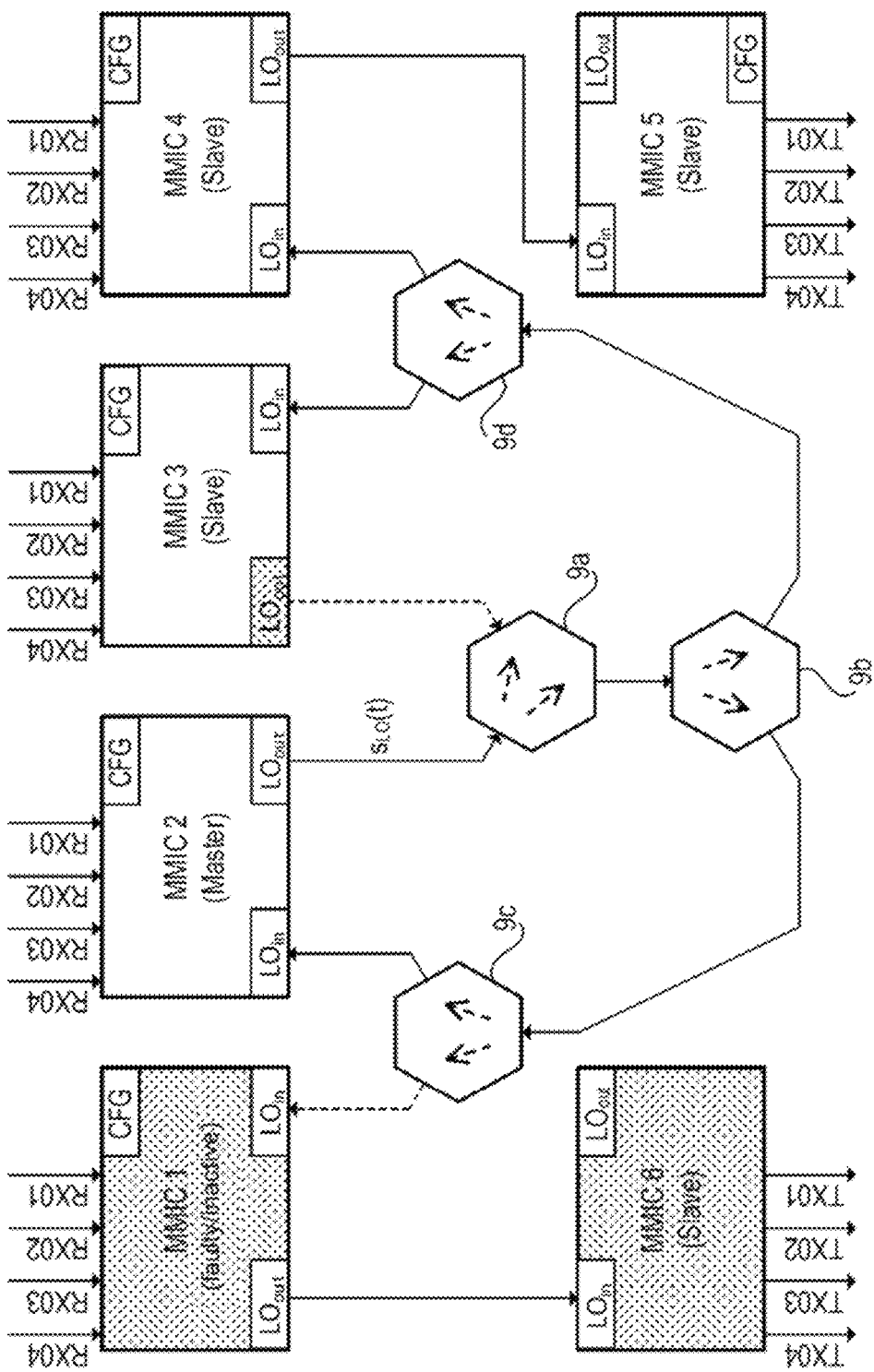
Figure 17C:
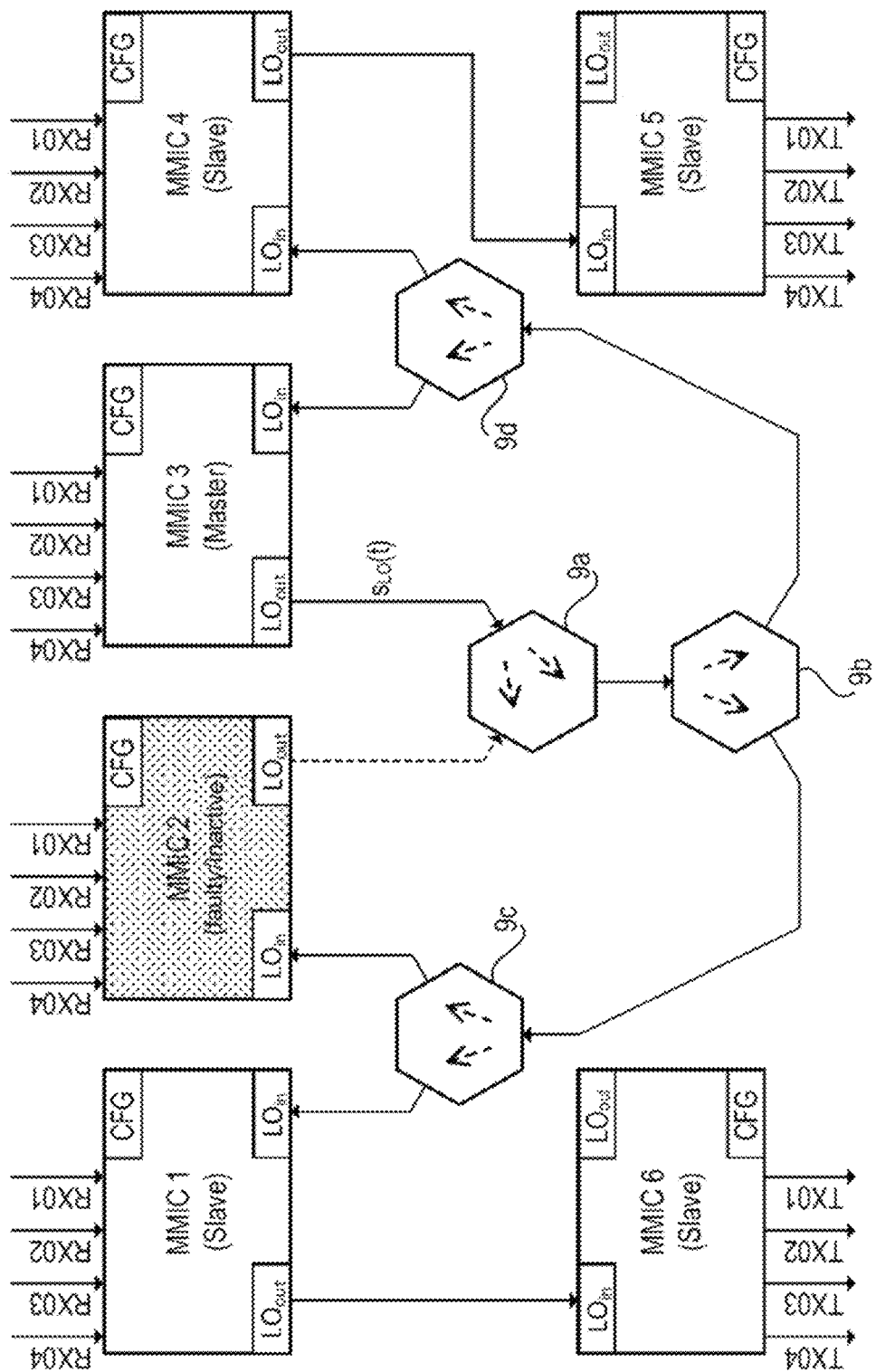

FIGS. 17A-17C show a radar system comprising six MMICs 1-6, which system is constructed very similarly to the system from FIGS. 16A-16D. The difference with respect to the previous examples resides in the (symmetrical) distribution of the LO signal $s_{LO}(t)$, as a result of which in the case of an inactive MIMIC, inter alfa, the radar system is prevented from decomposing into two independent subsystems. In this example implementation, all the TX channels have identical phases on account of a substantially identical length of the RF signal lines in the LO signal distribution. Likewise, different RX channels have substantially identical phases on account of an identical length of the RF signal lines in the LO signal distribution.

In the example in accordance with FIG. 17A—in a manner similar to that in FIGS. 8 and 9—a coupler arrangement having a plurality of couplers 9a-9d is used to distribute the LO signal $s_{LO}(t)$ from the master MIMIC 2 to all the slave MMICs 1, 6 and 3 to 5. Unlike in FIG. 8 or 9, the MMICs 1 to 6 each have an LO input $LO_{in}$ and an LO output $LO_{out}$. In the situation illustrated in FIG. 17A (normal operation, all MMICs functional), the MMIC 2 is configured as master MMIC. That is to say that the local oscillator in the master MMIC 2 is active and generates the LO signal $s_{LO}(t)$, which is output at the LO output $LO_{out}$ of the master MMIC and is transferred to the coupler 9a. The coupler 9a forwards the LO signal $s_{LO}(t)$ to the coupler 9b and to the LO output of the slave MMIC 3, which is not active, however, in the situation illustrated. The (inactive) LO output $LO_{out}$ of the slave MMIC 3 is designed such that no or only a very small part of the arriving signal power is reflected. The coupler 9b forwards the LO signal to the couplers 9c and 9d.

The coupler 9c distributes the arriving LO signal $s_{LO}(t)$ to the MMICs 1 and 2, that is to say that the LO signal $s_{LO}(t)$ is fed to the LO input $LO_{in}$ of the slave MMIC 1 and also to the LO input $LO_{in}$ of the master MMIC 2. The LO signal $s_{LO}(t)$ output by the master MMIC 2 is thus also fed back again to the master MMIC 2 via the couplers 9a, 9b and 9c. This self feedback has the effect that the LO signal $s_{LO}(t)$ arriving at the MMICs traverses a signal path of the same length, and the signal $s_{LO}(t)$ thus arrives at the LO inputs $LO_{in}$ of the MMICs 2 to 4 (in which the RX channels are arranged) substantially with the same phase.

The coupler 9d distributes the arriving LO signal $s_{LO}(t)$ to the MMICs 3 and 4, that is to say that the LO signal $s_{LO}(t)$ is fed to the LO input $LO_{in}$ of the slave MIMIC 3 and also to the LO input $LO_{in}$ of the slave MMIC 4. The slave MMICs 5 and 6 receive the LO signal $s_{LO}(t)$ from the MMICs 1 and 4, respectively, as in the previous example in accordance with FIGS. 16A-16D. The situation illustrated in FIG. 17A relates to the abovementioned first operating mode (normal operation).

FIG. 17B shows a situation in which—in a manner similar to that in FIG. 16B—the MMIC 1 is configured as inactive. In this case, MMIC 2 can no longer forward the LO signal to the MIMIC 6. The distribution of the LO signal $s_{LO}(t)$ from the master MMIC 2 to the MMICs 3, 4, and 5 (via the couplers 9a, 9b and 9d) and also the self feedback via the couplers 9a, 9b and 9c are not impaired, however, and that subsystem of the radar system which is formed by the MMICs 2 to 5 with four TX channels and twelve RX channels remains functional. A reconfiguration (master mode/slave mode) of the MMICs is not necessary. MIMIC 2 continues to operate in the master mode, and the MMICs 3-5 continue to operate in the slave mode. During the processing of the digital radar signals, however, it should be taken into consideration that only a portion of the RX and TX channels is available. The same also applies to the example from FIGS. 16A-16D.

FIG. 17C shows a situation in which—in a manner similar to that in FIG. 16C—the MMIC 2 is inactive. In this case, the MMIC 2 can no longer provide the LO signal $s_{LO}(t)$ for the other MMICs, and the MMIC 3 is thus reconfigured such that it operates as new master MMIC and generates an LO signal (master mode). In this operating mode, the MIMIC 3 outputs the LO signal $s_{LO}(t)$ of its local oscillator at the LO output $LO_{out}$ to the coupler 9a. The coupler 9a forwards the LO signal to the coupler 9b, from where the LO signal $s_{LO}(t)$, as already described with reference to FIG. 17A, is distributed further via the couplers 9c and 9d to the MMICs 1, 3 and 4 (MIMIC 2 is inactive in the present example). It should be noted at this juncture that in the situation illustrated in FIG. 17C, too, the LO signal $s_{LO}(t)$ output by the MIMIC 3 is fed back to the MIMIC 3 (via the couplers 9a, 9b and 9d). That subsystem of the radar system which is formed by the MMICs 1, and 3 to 6 with eight TX channels and twelve RX channels thus remains functional. The situations illustrated in FIGS. 17B and 17C show the above-mentioned emergency operation (second and third operating modes, respectively).

In the event of a failure of the MMIC 3 (not shown in FIGS. 17A-17C), a reconfiguration of the slave chips is not necessary. The distribution of the LO signal $s_{LO}(t)$ from the master MMIC 2 to the MMICs 1, 4, 5 and 6 (via the couplers 9a, 9b and 9d) and also the self feedback via the couplers 9a, 9b and 9c are not impaired by a defective MMIC 3; that subsystem of the radar system which is formed by the MMICs 1, 2 and 4 to 6 with eight TX channels and twelve RX channels remains functional. As also in the cases already described, however, during the processing of the digital radar signals, it should be taken into consideration that only a portion of the RX and TX channels is available. In the event of a failure of the MIMIC 1—as in the example from FIGS. 16A-16D—the slave MIMIC 6 is also cut off from the remaining subsystem comprising the MMICs 2 to 5, which can then operate with only four TX channels. The same applies to a failure of the MIMIC 4, as a result of which the MMIC 5 would be cut off from the remaining subsystem comprising the MMICs 1 to 3 and 6. If the MMICs 1 and 4 have one or more additional LO outputs, it is possible to connect further slave MMICs having integrated TX channels in order to increase the number of TX channels.

Finally, it is also noted that the division of RX channels and TX channels into separate chips (MMICs) can afford advantages. In this regard, this separation of RX and TX channels makes it possible to avoid crosstalk from TX channels to RX channels within a chip (on-chip crosstalk). The TX channels can be integrated in comparatively simple RF power amplifier chips in which the comparatively complex circuits of the RX channels are not required. As a result, the costs of the overall system can be reduced. Furthermore, a better distribution of the heat by way of the carrier printed circuit board on which the chips are arranged can be achieved. It is also possible to distribute the chips among a plurality of carrier printed circuit boards.

With just four MMICs it is possible—in a manner similar to that in FIGS. 16A-16D and 17A-17C—to construct a radar system comprising RX and TX channels arranged in separate MMICs which remains functional (to a limited extent) in the event of the failure of a single MMIC. By way of example, in the system from FIGS. 16A-16D, the MMICs 3 and 4 could be omitted and MIMIC 5 (RF power amplifier chip having the integrated TX channels) could be connected to MMIC 2. In this case, the complete system has eight RX channels and eight TX channels. If one of the RF power amplifier chips having the integrated TX channels (i.e. MMICs 5 and 6) fails, a subsystem having four TX channels and eight RX channels can continue to operate. If one of the MMICs having the RX channels (MMIC 1 or 2) fails, a subsystem having four TX channels and four RX channels can continue to operate. If the master MMIC 1 fails, MMIC 2 can be reconfigured as master.

The foregoing disclosure provides illustration and description, but is not intended to be exhaustive or to limit the implementations to the precise form disclosed. Modifications and variations may be made in light of the above disclosure or may be acquired from practice of the implementations.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related and unrelated items, etc.), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A radar system, comprising:
a plurality of radar chips including a first radar chip, a second radar chip, and a third radar chip,
wherein each of the plurality of radar chips comprises a local oscillator configured to generate a radio frequency (RF) oscillator signal in a switched-on state, and
a bidirectional coupler comprising:
a first port coupled to a first RF contact of the first radar chip,
a second port coupled to a second RF contact of the second radar chip, and
a third port coupled to a third RF contact of the third radar chip,
wherein the first RF contact, the second RF contact, and the third RF contact are coupled via the bidirectional coupler in such a way to permit:

in a first operating mode, the local oscillator of the
first radar chip to generate the RF oscillator signal
and the bidirectional coupler to transfer the RF
oscillator signal from the first RF contact of the
first radar chip to the first port, from the first port
to the second port and the third port, from the
second port to the second RF contact, and from the
third port to the third RF contact, and in a second operating mode, the local oscillator of the
second radar chip to generate the RF oscillator
signal and the bidirectional coupler to transfer the
RF oscillator signal from the second RF contact of
the second radar chip to at least one of the first RF
contact the first radar chip via the first port or the
third RF contact of the third radar chip via the
third port.

2. The radar system as claimed in claim 1, wherein the first RF contact, the second RF contact, and the third RF contact are configurable both as an output port, to provide the RF oscillator signal generated in a respective radar chip of the second radar chip and the third radar chip, and as an input port to receive another RF oscillator signal generated in a different radar chip of the second radar chip and the third radar chip.

3. The radar system as claimed in claim 1, further comprising:
a system controller, which is coupled to a configuration input of the plurality of radar chips and is configured to transfer configuration data to the plurality of radar chips.

4. The radar system as claimed in claim 3, wherein the plurality of radar chips are configured to operate in a master mode or in a slave mode depending on the configuration data received from the system controller,
wherein, in the master mode, the local oscillator of a particular radar chip, of the first radar chip, the second radar chip, and the third radar chip, is active and generates the RF oscillator signal, and in the slave mode, the local oscillator of the particular radar chip is inactive.

5. The radar system as claimed in claim 4, wherein, in the first operating mode, the first radar chip is configured for the master mode and the second radar chip and the third radar chip are configured for the slave mode.

6. The radar system as claimed in claim 4, wherein, in the second operating mode, the local oscillator of the first radar chip is deactivated, the second radar chip is configured for the master mode, and the third radar chip is configured for the slave mode.

7. The radar system as claimed in claim 4, wherein the system controller is configured to:
detect whether a particular radar chip, of the first radar chip, the second radar chip, and the third radar chip, operating in the master mode is operating properly, and
if the particular radar chip operating in the master mode is not operating properly, reconfigure the radar system, such that the local oscillator of the particular radar chip is deactivated and another particular radar chip, of the first radar chip, the second radar chip, and the third radar chip, previously operating in the slave mode is operating in the master mode.

8. The radar system as claimed in claim 3, wherein the system controller is further configured to receive, from at least one of the first radar chip, the second radar chip, or the third radar chip, a status signal indicating whether the first radar chip is operating properly.

9. The radar system as claimed in claim 8, wherein the first radar chip is configured to carry out a self-test in order to test whether at least one of the first radar chip, the second radar chip, or the third radar chip is operating properly, and
wherein the status signal depends on a result of the self-test.

10. The radar system as claimed in claim 1, wherein the plurality of radar chips are connected to the bidirectional coupler in a star circuit.

11. The radar system as claimed in claim 1, wherein the bidirectional coupler is a ring coupler.

12. The radar system of claim 1, wherein the second port of the bidirectional coupler is configured to receive the RF signal in the first operating mode and output the RF signal in the second operating mode.

13. The radar system of claim 1, wherein the second RF contact of the second radar chip is configured to receive the RF signal in the first operating mode and output the RF signal in the second operating mode.

14. A method for operating a radar system comprising:
a first radar chip, a second radar chip, and a third radar chip that each comprises a local oscillator configured to generate a radio frequency (RF) oscillator signal in a switched-on state, and
a bidirectional coupler comprising:
a first port coupled to a first RF contact of the first radar chip,
a second port coupled to a second RF contact of the second radar chip, and
a third port coupled to a third RF contact of the third radar chip,
wherein the first RF contact, the second RF contact, and the third RF contact are coupled via the bidirectional coupler in such a way to permit:
in a first operating mode, the first radar chip to operate in a master mode and the local oscillator of the first radar chip to generate the RF oscillator signal and the bidirectional coupler to transfer the RF oscillator signal from the first RF contact of the first radar chip to the first port, from the first port to the second port and the third port, from the second port to the second RF contact, and from the third port to the third RF contact, and
in a second operating mode, the second radar chip to operate in the master mode and the local oscillator of the second radar chip to generate the RF oscillator signal and the bidirectional coupler to transfer the RF oscillator signal from the second RF contact of the second radar chip to at least one of the first RF contact the first radar chip via the first port or the third RF contact of the third radar chip via the third port, the method comprising:
detecting whether the first radar chip operating in the master mode is operating properly; and
if the radar chip operating in the master mode is not operating properly, reconfiguring the radar system to operate in the second operating mode.

15. The method as claimed in claim 14, wherein the reconfiguring comprises:
transmitting configuration data from a system controller to the first radar chip, the second radar chip, and the third radar chip.

16. The method as claimed in claim 14, wherein the detecting whether the first radar chip operating in the master mode is operating properly comprises:

carrying out a self-test, using the first radar chip, to determine whether the first radar chip is operating properly; and generating a status signal based on a result of the self-test.

17. The method of claim 14, wherein at least one of:

the second port of the bidirectional coupler is configured to receive the RF signal in the first operating mode and output the RF signal in the second operating mode, or the second RF contact of the second radar chip is configured to receive the RF signal in the first operating mode and output the RF signal in the second operating mode.

18. A radar system comprising:
a plurality of radar chips including a first radar chip, a second radar chip, and a third radar chip,
  wherein each of the plurality of radar chips comprises a local oscillator configured to generate an RF oscillator signal; and
a bidirectional coupler comprising:
  a first port coupled to a first RF contact of the first radar chip,
  a second port coupled to a second RF contact of the second radar chip, and
  a third port coupled to a third RF contact of the third radar chip,
  wherein the first RF contact, the second RF contact, and the third RF contact are coupled via the bidirectional coupler in such a way to permit:
    in a first operating mode, the local oscillator of the first radar chip to generate the RF oscillator signal and the bidirectional coupler to transfer the RF oscillator signal from the first RF contact of the first radar chip to the first port, from the first port to the second port and the third port, from the second port to the second RF contact, and from the third port to the third RF contact, and
    in a second operating mode, the local oscillator of the second radar chip to generate the RF oscillator signal and the bidirectional coupler to transfer the RF oscillator signal from the second RF contact of the second radar chip to at least one of the first RF contact the first radar chip via the first port or the third RF contact of the third radar chip via the third port.

19. The radar system as claimed in claim 18, wherein, in the first operating mode, a line length for transferring the RF oscillator signal from the first radar chip to the second radar chip and the third radar chip is different.

20. The radar system as claimed in claim 18, wherein, in the first operating mode, a line length for transferring the RF oscillator signal from the first radar chip to the second radar chip and the third radar chip is identical.

21. The radar system as claimed in claim 20, wherein, in the second operating mode, the line length for transferring the RF oscillator signal from the second radar chip back to itself and to the third radar chip is identical.

22. A radar system comprising:
a first subsystem comprising a first radar chip and a second radar chip, wherein each of the first radar chip and the second radar chip comprises a local oscillator configured to generate a radio frequency (RF) oscillator signal in a switched-on state; and
a second subsystem comprising a third radar chip and a fourth radar chip, wherein each of the third radar chip and the fourth radar chip comprises the local oscillator configured to generate the RF oscillator signal in the switched-on state; and a bidirectional coupler comprising:
  a first port coupled to a first RF contact of the first radar chip, of the first subsystem, or the third radar chip of the second subsystem, and
  a second port coupled to a second RF contact of the second radar chip, of the first subsystem, or the fourth radar chip of the second subsystem,
  wherein the first subsystem and the second subsystem are coupled to the bidirectional coupler in such a way to permit:
    in a first operating mode,
      the second radar chip, of the first subsystem, to output the RF oscillator signal, generated from of the local oscillator of the second radar chip or received from the first radar chip, to the second port of the bidirectional coupler via the second RF contact of the second radar chip, or,
      the third radar chip, of the second subsystem, to receive the RF oscillator signal, output by the second radar chip, from the first port of the bidirectional coupler and via the first RF contact of the third radar chip, and
    in a second operating mode, the third radar chip is either to:
      output the RF oscillator signal, generated from the local oscillator of the third radar chip or received from the fourth radar chip, to the first port of the bidirectional coupler and via the first RF contact of the third radar chip, or
      receive the RF oscillator signal, generated by the fourth radar chip of the second subsystem, from the first port of the bidirectional coupler and via the first RF contact of the third radar chip.

23. The radar system as claimed in claim 22, wherein, in the first operating mode, both the first subsystem and the second subsystem use the RF oscillator signal generated by the first radar chip or the second radar chip of the first subsystem.

24. The radar system as claimed in claim 22, wherein the first subsystem and the second subsystem each comprises receiving channels, for connecting receiving antennas, and transmitting channels for connecting transmitting antennas.

25. A radar system comprising:
a first subsystem comprising a first radar chip and a second radar chip, and
a second subsystem comprising a third radar chip and a fourth radar chip,
  wherein the second radar chip of the first subsystem and the fourth radar chip of the second subsystem comprise transmitting channels for connecting transmitting antennas, but no receiving channel,
  wherein the second radar chip of the first subsystem is directly or indirectly coupled to the first radar chip of the first subsystem in order to receive a local oscillator (LO) signal output by the first radar chip, and
  wherein the fourth radar chip of the second subsystem is directly or indirectly coupled to the third radar chip of the second subsystem in order to receive an LO signal output by the third radar chip,
  wherein the first radar chip of the first subsystem is configured, in a first operating mode, to generate the LO signal, using a local oscillator, and to transfer the LO signal via one or more radio frequency lines directly or indirectly to the third radar chip of the second subsystem, and
  wherein the third radar chip of the second subsystem is configured, in a second operating mode, in which no LO signal is transferred into the second subsystem by the first subsystem, to generate a further LO signal using a further local oscillator.

26. The radar system as claimed in claim 25, wherein the first radar chip of the first subsystem and the third radar chip of the second subsystem each comprises a plurality of receiving channels for connecting receiving antennas, but no transmitting channel.

\* \* \* \* \*